(12) United States Patent
Sunkara et al.

(10) Patent No.: US 7,713,352 B2
(45) Date of Patent: *May 11, 2010

(54) SYNTHESIS OF FIBERS OF INORGANIC MATERIALS USING LOW-MELTING METALS

(75) Inventors: Mahendra Kumar Sunkara, Louisville, KY (US); Shashank Sharma, San Jose, CA (US); Hari Chandrasekaran, Louisville, KY (US); Hongwei Li, Bethlehem, PA (US); Sreeram Vaddiraju, Louisville, KY (US)

(73) Assignee: University of Louisville Research Foundation, Inc., Louisville, KY (US)

( * ) Notice: Subject to any disclaimer, the term of this patent is extended or adjusted under 35 U.S.C. 154(b) by 691 days.

This patent is subject to a terminal disclaimer.

(21) Appl. No.: 11/521,084

(22) Filed: Sep. 14, 2006

(65) Prior Publication Data
US 2007/0095276 A1     May 3, 2007

Related U.S. Application Data

(63) Continuation-in-part of application No. 10/664,072, filed on Sep. 16, 2003, now Pat. No. 7,182,812, and a continuation-in-part of application No. 10/187,460, filed on Jul. 1, 2002, now Pat. No. 7,252,811.

(60) Provisional application No. 60/411,116, filed on Sep. 16, 2002, provisional application No. 60/302,062, filed on Jun. 29, 2001.

(51) Int. Cl.
*C30B 17/00* (2006.01)
*C30B 23/00* (2006.01)

(52) U.S. Cl. .................. 117/90; 117/75; 117/76; 117/77; 117/78; 117/79; 117/80; 117/81; 117/82; 117/83; 117/85; 977/720; 977/762; 977/809; 977/810; 977/825

(58) Field of Classification Search .................. 977/720, 977/762, 809–825; 257/435; 349/1; 117/75–83, 117/85–92
See application file for complete search history.

(56) References Cited

U.S. PATENT DOCUMENTS 4,886,683 A     12/1989   Hoke et al.
(Continued)

FOREIGN PATENT DOCUMENTS

JP     2086121     3/1990
JP     11177134    7/1999

OTHER PUBLICATIONS

Publication No. WO026422A1 for "High Purity Gallium for Preparation of Compound Semiconductor, and Method and Apparatus for Purifying the Same" by Yamamura et al., published on May 11, 2000.
(Continued)

*Primary Examiner*—Robert M Kunemund
*Assistant Examiner*—G. Nagesh Rao
(74) *Attorney, Agent, or Firm*—Stites & Harbison PLLC; Terry L. Wright; Mandy Wilson Decker

(57) ABSTRACT

A process is provided to produce bulk quantities of nanowires in a variety of semiconductor materials. Thin films and droplets of low-melting metals such as gallium, indium, bismuth, and aluminum are used to dissolve and to produce nanowires. The dissolution of solutes can be achieved by using a solid source of solute and low-melting metal, or using a vapor phase source of solute and low-melting metal. The resulting nanowires range in size from 1 nanometer up to 1 micron in diameter and lengths ranging from 1 nanometer to several hundred nanometers or microns. This process does not require the use of metals such as gold and iron in the form of clusters whose size determines the resulting nanowire size. In addition, the process allows for a lower growth temperature, better control over size and size distribution, and better control over the composition and purity of the nanowire produced therefrom.

44 Claims, 38 Drawing Sheets

U.S. PATENT DOCUMENTS

| | | | |
|---|---|---|---|
| 4,939,308 A | | 7/1990 | Maxfield et al. |
| 5,120,707 A | | 6/1992 | Maxfield et al. |
| 5,334,296 A | | 8/1994 | Henkens et al. |
| 5,381,753 A | * | 1/1995 | Okajima et al. ............... 117/12 |
| 5,725,674 A | | 3/1998 | Moustakas et al. |
| 5,858,862 A | | 1/1999 | Westwater et al. |
| 5,922,183 A | | 7/1999 | Rauh |
| 5,962,863 A | | 10/1999 | Russell et al. |
| 6,033,866 A | | 3/2000 | Guo et al. |
| 6,051,849 A | | 4/2000 | Davis et al. |
| 6,063,246 A | | 5/2000 | Wolfe et al. |
| 6,806,228 B2 | | 10/2004 | Sharma et al. |
| 7,182,812 B2 | * | 2/2007 | Sunkara et al. ............. 117/103 |
| 7,241,432 B2 | * | 7/2007 | Sharma et al. ............... 423/324 |
| 7,252,811 B2 | * | 8/2007 | Sunkara et al. ............. 423/326 |
| 7,442,575 B2 | * | 10/2008 | Coffer ........................ 438/105 |
| 7,445,671 B2 | * | 11/2008 | Sunkara et al. ............... 117/40 |
| 7,521,274 B2 | * | 4/2009 | Hersee et al. .................. 438/41 |
| 7,553,371 B2 | * | 6/2009 | Dubrow et al. ................ 117/90 |
| 2003/0039602 A1 | * | 2/2003 | Sharma et al. ............. 423/349 |
| 2006/0159916 A1 | * | 7/2006 | Dubrow et al. ............. 428/357 |
| 2006/0165952 A1 | * | 7/2006 | Dubrow ........................ 428/97 |
| 2006/0204738 A1 | * | 9/2006 | Dubrow et al. ........... 428/292.1 |
| 2007/0003467 A1 | * | 1/2007 | Sunkara et al. ............. 423/348 |
| 2007/0095276 A1 | * | 5/2007 | Sunkara et al. ............. 117/103 |
| 2007/0209576 A1 | * | 9/2007 | Sunkara et al. ............... 117/87 |
| 2008/0069769 A1 | * | 3/2008 | Cao ........................... 423/704 |
| 2008/0170982 A1 | * | 7/2008 | Zhang et al. ............. 423/447.3 |
| 2008/0241531 A1 | * | 10/2008 | Belcher et al. ............. 428/372 |
| 2009/0072728 A1 | * | 3/2009 | Moran-Mirabal et al. ... 313/504 |

OTHER PUBLICATIONS

Publication No. WO9965068A1 for "Fabrication of Gallium Nitride Semiconductor Layers by Lateral Growth From Trench Sidewalls" by Zheleva et al., published on Dec. 16, 1999.

Publication No. WO9944224A1 for "Method of Fabricating Gallium Nitride Semiconductor Layers by Lateral Overgrowth Through Masks, and Gallium Nitride Semiconductor Structures Fabricated Thereby" by Davis et al., published on Sep. 2, 1999.

Y.F. Zhang, Y.H. Tang, N. Wang, C.S. Lee, I. Bello, S.T. Lee "One Dimensional Growth Mechanism of Crystalline Silicon Nanowires," Journal of Crystal Growth 197 (1999) 136-140.

J. Westwater, D.P. Gosain, S. Tomiya, S. Usui, and H. Ruda "Growth of Silicon Nanowires Via Gold/Silane Vapor-Liquid-Solid Reaction," J. Vac. Sci. Technol. B 15(3), May/Jun. 1997, 554-557.

A.M. Morales and C.M. Lieber "A Laser Ablation Method for the Synthesis of Crystalline Semiconductor Nanowires," Science, vol. 279, Jan. 9, 1998, 208-211.

H.F. Yan, Y.J. Xing, Q.L. Hang, D.P. Yu, Y.P. Wang, J. Xu, Z.H. Xi, S.Q. Feng "Growth of Amorphous Silicon Nanowires Via a Solid-Liquid-Solid Mechanism," Chemical Physics Letters 323 (2000) 224-228.

J.L. Gole and J.D. Stout, W.L. Rauch and Z.L. Wang "Direct Synthesis of Silicon Nanowires, Silica Nanospheres, and Wire-Like Nanosphere Agglomerates," Applied Physics Letters, vol. 76, No. 17, Apr. 24, 2000, 2346-2348.

J.D. Holmes, K.P. Johnston, R.C. Doty, B.A. Korgel "Control of Thickness and Orientation of Solution-Grown Silicon Nanowires," Science, vol. 287, Feb. 25, 2000, 1471-1473.

P. Scheier, J. Marsen, M. Lonfat, W. Schneider, K. Sattler "Growth of Silicon Nanostructures on Graphite," Surface Science 458 (2000, 113-122).

D.P. Yu, Z.G. Bai, Y. Ding, Q. L. Hang, H.Z. Zhang, J.J. Wang, Y.H. Zou, W. Qian, G.C. Xiong, H.T. Zhou, and S.Q. Feng "Nanoscale Silicon Wires Synthesized Using Simple Physical Evaporation," Applied Physics Letters, vol. 72, No. 26, Jun. 29, 1998, 3458-3460.

Sharma et al. "Novel Vapor-Liquid-Solid Synthesis Method for Carbon Nanostructures," presented on CD and at Carbon2001 Conference at the University of Kentucky, Lexington, KY in Jul. 2001.

Zhang et al. "Morphology and Growth Mechanism Study of Self-Assembled Silicon Nanowires Synthesized by Thermal Evaporation," Chemical Physics Letter 337 (2001) 18-24, Mar. 30, 20014.

Wu et al. "Germanium Nanowire Growth Via Simple Vapor Transport," Chem. Mater. 2000, 12, 605-607.

Y. F. Zhang, Y.H. Tanh, N. Wang, D,P, Yu, C.S. Lee, I. Bello, and S.T. Lee "Silicon Nanowires Prepared by Laser Ablation At High Temperature," Applied physics Letters, vol. 72, No. 15, Apr. 13, 1998, 1835-1837.

D.P. Yu, Y.J. Xing, Q.L. Hang, H.F. Yan, J. Xu, Z.H. Xi, S.Q. Feng "Controlled Growth of Oriented Amorphous Silicon Nanowires Via a Solid-Liquid-Solid (SLS) Mechanism," Physica E 9 (2001) 305-309.

Lieber, "One Dimensional Nanostructures: Chemistry, Physics & Applications," Solid State Communications, vol. 107, No. 11, 607-616.

C.H. Liang, G.W. Meng, G.Z. Wang, Y.W. Wang, L.D. Zhang, and S.Y. Zhang, "Catalytic Synthesis and Photoluminescence of $Ga_2O_3$ Nanowires" Appl. Phys. Lett. 78, 3202 (2001).

Y.C. Choi, W.S. Kim, Y.S. Park, S.M. Lee, D.J. Bae, Y.H. Lee, G-S Park, W.B. Choi, N.S. Lee and J.M. Kim, "Catalytic Growth of $Ga_2O_3$ Nanowires by Arc Discharge" Adv. Mater. 12, 746 (2000).

W.Q. Han, P. Kohler-Redlich, F. Ernest, and M. Ruhle, "Growth and Microstructure of $Ga_2O_3$ Nanorods" Solid State Commun. 115, 527 (2000).

J.Q. Hu, X.L. Ma, N.G. Shang, Z.Y. Xie, N.B. Wong, C.S. Lee, and S.T. Lee, "Large-Scale Rapid Oxidation Synthesis of $SnO_2$ Nanoribbons" J. Phys. Chem. B 106, 3823 (2002).

X.S. Peng, Y.W. Wang, J. Zhang, X.F. Wang, L.X. Zhao, G.W. Meng, and L.D. Zhang, "Large Scale Synthesis of $In_2O_3$ Nanowires" Appl. Phys. A 74, 437 (2002).

G. Gundiah, A. Govindaraj, and C.N.R. Rao, "Nanowires, Nanobelts and Related Nanostructures of $Ga_2O_3$" Chem. Phys. Lett. 351, 189 (2002).

S. Sharma and M.K. Sunkara, "Direct Synthesis of Gallium Oxide Tubes, Nanowires, and Nanopaintbrushes" The Journal of the American Chemical Society, 124, 12288-12293, (In Press, 2002).

Z.R. Dai, Z.W. Pan, and Z.L. Wang, "Gallium Oxide Nanoribbons and Nanosheets" J. Phys. Chem. B 106, 902-904 (2002).

M.H. Huang, Y. Wu, H. Feick, N. Tran, E. Weber, and P. Yang, "Catalytic Growth of Zinc Oxide Nanowires by Vapor Transport" Adv. Mater. 13, 113 (2001).

* cited by examiner

SYNTHESIS OF FIBERS OF INORGANIC MATERIALS USING LOW-MELTING METALS

RELATED APPLICATIONS

This application is a Continuation-In-Part of U.S. application Ser. No. 10/664,072, filed on Sep. 16, 2003, now U.S. Pat. No. 7,182,812, claiming priority from U.S. Provisional Application Ser. No. 60/411,116, filed on Sep. 16, 2002, and is a Continuation-In-Part of U.S. application Ser. No. 10/187,460, now U.S. Pat. No. 7,252,811, filed on Jul. 1, 2002, claiming priority from U.S. Provisional Application Ser. No. 60/302,062, filed on Jun. 29, 2001, all of which are incorporated by reference herein.

This application is part of a government project. The research leading to this invention was supported by a Grant Number 9876251 from the National Science Foundation and Air Force Office of Scientific Research. The United States Government retains certain rights in this invention.

TECHNICAL FIELD OF THE INVENTION

The invention relates to the field of providing a synthesis technique to grow bulk quantities of semiconductor nanowires, whiskers, and rods at temperatures as low as the eutectic temperatures of the low-melting metal selected which can range from as low as 30° to 800° C.

BACKGROUND OF THE INVENTION

Description of the Prior Art

One-dimensional semiconductor fibers are useful for many applications ranging from probe microscopy tips to interconnections in nanoelectronics. By "one-dimensional" it is meant that the fibers have extremely small diameters, approaching 40 Ångstroms. The fibers may be termed "nanowires" or "nanowhiskers." Several methods are known for synthesis of these fibers such as VLS (vapor-liquid-solid) mechanism-based synthesis of silicon and silicon oxide species, and variations of these techniques. In all of these techniques, the metal cluster size is used to control the size of resulting wires.

In VLS growth, a liquid metal cluster or catalyst acts as the energetically favored site of absorption of gas-phase reactants. Solid materials are evaporated and the vapor is condensed on the substrate and under controlled temperature, pressure, and morphology conditions the solid material condenses to form nanostructures. It is possible to control the conditions and select catalysts which form condensation nuclei during the vapor phase deposition of the nanomaterials in order to facilitate one-dimensional growth so that the cluster supersaturates and the material grows in one dimension. The VLS mechanism has been used to grow silicon nanowires by catalytic decomposition of silane vapor on a gold metal surface. Variations of this mechanism have been used to produce other semiconductor fibers; however, the deposition rate is often small due to limitations of the process and at higher deposition rates the ability to form fibers may be lost.

Other low melting substrates or materials which can be used in the form of a cluster on a suitable substrate to propagate fiber growth include germanium, silicon oxide, gold, bismuth, gallium, indium, titanium, lead, zinc, tin, aluminum, copper, nickel, platinum, iron, cobalt, silver, and their oxides including FeCo, NiFe, AuAg, cuNi, and Si, and their nitrides, sulfides, phosphides, and antimonides.

These techniques using the VLS mechanism typically utilize metals such as gold and iron in the form of a cluster whose size determines the resulting nanowire size.

SUMMARY OF THE INVENTION

The technique described in this invention does not require the use metals such as gold and iron in the form of a cluster whose size determines the resulting nanowire size.

The present invention provides a method of synthesizing semiconductor fibers by placement of a low melting material such as gallium or indium on a suitable substrate such as silicon, quartz, germanium or pyrolytic boron nitride.

A process is provided to produce bulk quantities of nanowires in a variety of semiconductor materials. Thin films and droplets of low-melting metals such as gallium, indium, bismuth, and aluminum are used to dissolve and to produce nanowires. The dissolution of solutes can be achieved by using a solid source of solute and low-melting metal, or using a vapor phase source of solute and low-melting metal. The resulting nanowires range in size from 1 nanometer up to 1 micron in diameter and lengths ranging from 1 nanometer to several hundred nanometers or microns. This process does not require the use of metals such as gold and iron in the form of clusters whose size determines the resulting nanowire size. The instant process allows for a lower growth temperature, better control over size and size distribution, and better control over the composition and purity of the nanowire produced therefrom.

The present invention provides a lower growth temperature, provides better control over the size and size distribution of the nanowires, and provides better control over the composition and purity of the nanowires produced from the novel process described in the instant invention.

The novel process of the instant invention provides a technique which offers several advantages over conventional VLS techniques using silicon-transition metal eutectic for catalyzed growth.

The very low temperatures required when using low melting metals such as gallium and indium, alone and/or in combination with their oxides and nitrides and/or other metals as the dissolution medium allows easier integration with other processing techniques and materials involved in electronics and opto-electronic device fabrication. Nanometer scale one-dimensional semiconductor structure such as nanowires and nanowhiskers are expected to be critically important in advanced mesoscopic electronic and optical device applications.

In one embodiment of the invention, growth of silicon fibers was observed when silicon substrates covered with a thin film of gallium were exposed to mixture of nitrogen and hydrogen gas in a microwave-generated plasma. The resulting silicon wires ranged from a several microns to less than ten (10) nanometers in diameter. Results indicate that this technique is capable of producing oriented rods and whiskers with narrow diameter distributions.

The growth mechanism in this method is hypothesized to be as follows: rapid dissolution of silicon solute in gallium melt, formation of multiple nuclei, nuclei surfacing out of the gallium melt, basal growth of nuclei in one dimension to result in nanowire and nanowhisker fibers.

The high density of the fibers due to multiple nucleation and growth lends itself as a method for bulk production of nanowires and nanowhiskers.

The process provides a means for synthesizing bulk amounts of semiconductor nanofibers. One procedure involves disposing a low-melting metal on a substrate for example by forming a film or drop thereon, placing the low-melting metal on a substrate in a low-pressure chamber; adding a gaseous reactant thereto; applying energy to raise the temperature in the low-pressure chamber to a point above the melting point of the low-melting metal forming a molten metal film; activating and decomposing a gas phase yielding growth precursors and exposing the molten metal film to the activated gas phase; and continuing the process forming multiple nanofibers of the desired length.

Typical gaseous reactants include nitrogen, hydrogen, oxygen, silane, germane and monoatomic forms of same.

The advantages of low-temperature synthesis are also useful for those semiconductors in which the substrate and the fibers differ in composition. In such case, both or all fibers components may be provided in the vapor phase.

These and other objects of the present invention will be more fully understood from the following description of the invention.

BRIEF DESCRIPTION OF THE DRAWINGS

A better understanding of the present invention will be had upon reference to the following description in conjunction with the accompanying drawings in which like numerals refer to like parts throughout the several views and wherein.

DESCRIPTION OF THE PREFERRED EMBODIMENT

Figure 1:
FIG. 1 shows a multitude of nanowires.

The present invention provides a novel synthesis route for growing one-dimensional structures of semiconductor materials in wire, whisker and rod shapes at temperatures as low as the eutectic temperatures of the low-melting metal selected, for example gallium has a melting temperature as low as 30° C. More particularly, gallium has a broad temperature range for the melt phase of from 30° C. to 2200° C. at 1 atm. Another low melting metal, indium has a melting temperature of 156.6° C., and a melt range of 156.6° C. to 2000° C. and is also useful as a dissolution medium. This concept also includes the use of other low-melting metals such as bismuth, aluminum and their combination with any other metals and or their oxides.

The growth mechanism in this method is as follows: rapid dissolution of the solute, (for example silicon), in a dissolution media comprising a low melting metal melt (for example gallium), the formation of multiple nuclei, nuclei surfacing out of the metal (gallium) melt, and basal growth of nuclei in one dimension to result in nanofibers.

The process can be also be described as a method of synthesizing bulk quantities of crystalline metal oxide nanowires from noncatalytic low melting metals by placing a noncatalytic low-melting metal on a substrate in a low pressure chamber, and simultaneously exposing the noncatalytic low melting metal to a plasma containing a selected gaseous reactant such as monoatomic oxygen and/or monoatomic hydrogen in a gas phase heated to a temperature above the melting point of the low-melting metal forming a molten low-melting metal on the substrate and exposing the molten low-melting metal to a sufficient amount of the gaseous reactant in the gas phase forming a metal oxide. Multiple nucleations are formed and grow noncatalytic low melting metal oxide nanostructures directly therefrom creating crystalline metal oxide nanowires devoid of any structural defects.

A selected material in combination with a one or more selected low-melting metals are placed in a low pressure chamber at a vacuum from 1 mTorr to one atmosphere in an environment containing gaseous reactants containing the solutes (the desired fiber material) including hydrogen with or without halogens. It is contemplated that the gaseous reactants may include pure oxygen, a mixture or oxygen and other gases, oxygen-containing gas such as water vapor, hydrogen peroxide, or carbon and nitric oxides.

The temperature of the solute substrate is raised above the melting point using heat or other means. The gas mixture is activated in the form of DC discharges, low frequency and high frequency AC discharges and by thermal cracking. The discharge may be a hot-cathode discharge, a glow discharge, a hollow-cathode discharge, a radio-frequency discharge, a magnetron discharge or sputtering, a microwave discharge, chemical vapor disposition (CVD), a ECR discharge, a laser-beam discharge, a hot filament discharge, an arch discharge or other means of thermal evaporation. The gaseous discharge typically leads to the formation of a plasma and the formation of different gaseous radicals.

In one preferred embodiment, microwaves are utilized to activate the gas mixture, whereby the gaseous precursors form fibers of the desired length. With some metals, a temperature of about at least 30° C. is sufficient, and preferably from 200 to 300° C. is utilized for enhanced solubility and mobility within the melt.

The metal may be applied either in a solid such as a film or droplet form or supplied via vapor phase using gas phase precursors and can be placed in the form of patterned droplets. Droplet patterns may include droplets in two-dimensional and three-dimensional channels for directed growth. The solutes (desired materials) could also be supplied using substrates. In that case, the substrate would dissolve into low melting metals and nanofibers of desired diameter and length could be synthesized.

More particularly, the present invention provides a method of synthesizing semiconductor fibers by placement of gallium or indium metal or other low melting metals on a suitable substrate. The metal is placed in combination with the selected gallium or indium low-melting metal in a low pressure chamber at a vacuum from 1 mTorr to one atmosphere in an environment containing gaseous reactants which contain the solutes (the desired material) including hydrogen with or without halogens. The temperature of the substrate is raised above the melting point using heat or other means including microwave, hot-filaments, whereby the precursors form fibers of the desired length. When the low-melting metal is gallium, a temperature of about at least 30° C. is sufficient, and preferably near 300° C. for enhanced solubility and mobility within the melt. When the low-melting metal is indium, a temperature of about 200° C. is preferred for enhanced solubility and mobility of the melt.

The low-melting gallium metal may be applied either in solid or droplet form or supplied via vapor phase using gas phase precursors such as tri-methyl gallium or the metal can be placed in the form of patterned droplets. The gallium droplet patterns may include droplets in two-dimensional and three-dimensional channels for directed growth. The solutes (desired materials) can also be supplied using substrates. The substrate gets dissolved into low melting metals and fibers of desired diameter and length are formed.

Silicon fibers can be synthesized using either low-melting metals placed on a silicon substrate or using $SiH_4$ or $SiCl_xH_{4-x}$ gas phase species or organometallic compounds containing silicon.

Germanium fibers can be synthesized using either low-melting metals placed on germanium substrate or using $GeH_4$ or $GeCl_xH_{4-x}$ gas phase species or organometallic compounds containing germanium.

Similarly other semiconductors materials may be synthesized according to the methods of this invention. In each case, gallium or indium metal or other low-melting metals is used as the dissolution media. Where the solid substrate is not readily etched to provide a gaseous precursor, a vapor source can be added to the reactive atmosphere. In all cases, the gaseous reactants are diluted into inert gases such as nitrogen or argon or helium.

To more explicitly teach the methods of this invention, the following detailed embodiments are provided for purposes of illustration only. Those skilled in the art may readily make substitutions and variations in substrates and reactants to synthesize other semiconductors on a low-melting metal catalyst. Such substitutions and variations are considered to be within the spirit and scope of this invention.

Example 1

Bulk Synthesis of Silicon Fibers

Figure 6:
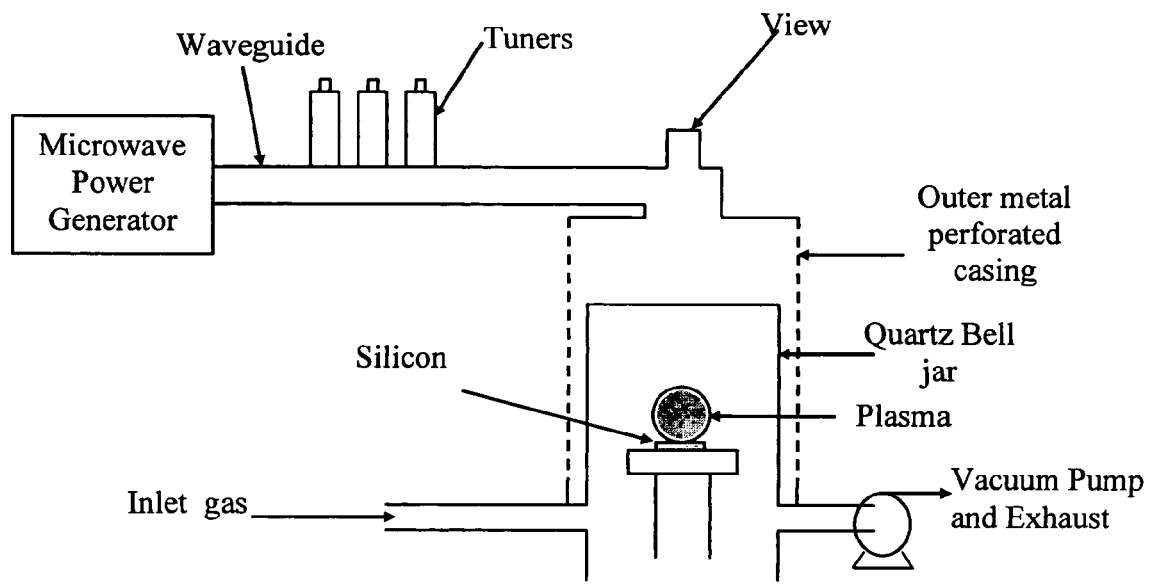
FIG. 6 is a schematic of the reaction chamber.

FIG. 6 shows a schematic of a type of reactor. A silicon substrate (2 cm×2 cm) was prepared by cleaning with a 45% HF solution, thoroughly rinsing in acetone and ultra-sonication. Droplets of gallium metal at 70° C. were applied to form a film with a thickness of approximately 100 microns. The nitrogen flow rate was set to 100 sccm. The pressure in the reactor was set to 30 Torr. Microwaves at 2.45 Ghz were used to ionize the nitrogen gas which served as the carrier gas. The input microwave power was 1000 W. The experiments were done in an ASTeX model 5010 bell jar reactor chamber equipped with an ASTeX model 2115 1500 W microwave power generator. 0.5 sccm of hydrogen were introduced into the nitrogen plasma. The reaction was carried out for six hours. Graphite blocks were used as substrate stage. The quartz bell jar volume was approximately 2000 cc.

After the growth experiments, the silicon substrate covered with an ashy mass was observed under a scanning electron microscope (SEM). FIGS. 1 through 16 show micrographs of silicon fibers of various thickness and length.

FIG. 1 shows a group of nanowires. These fibers were grown with H2/N2 ratio of 0.005, pressure of 30 Torr and microwave power of 1000 W.

Figure 2:
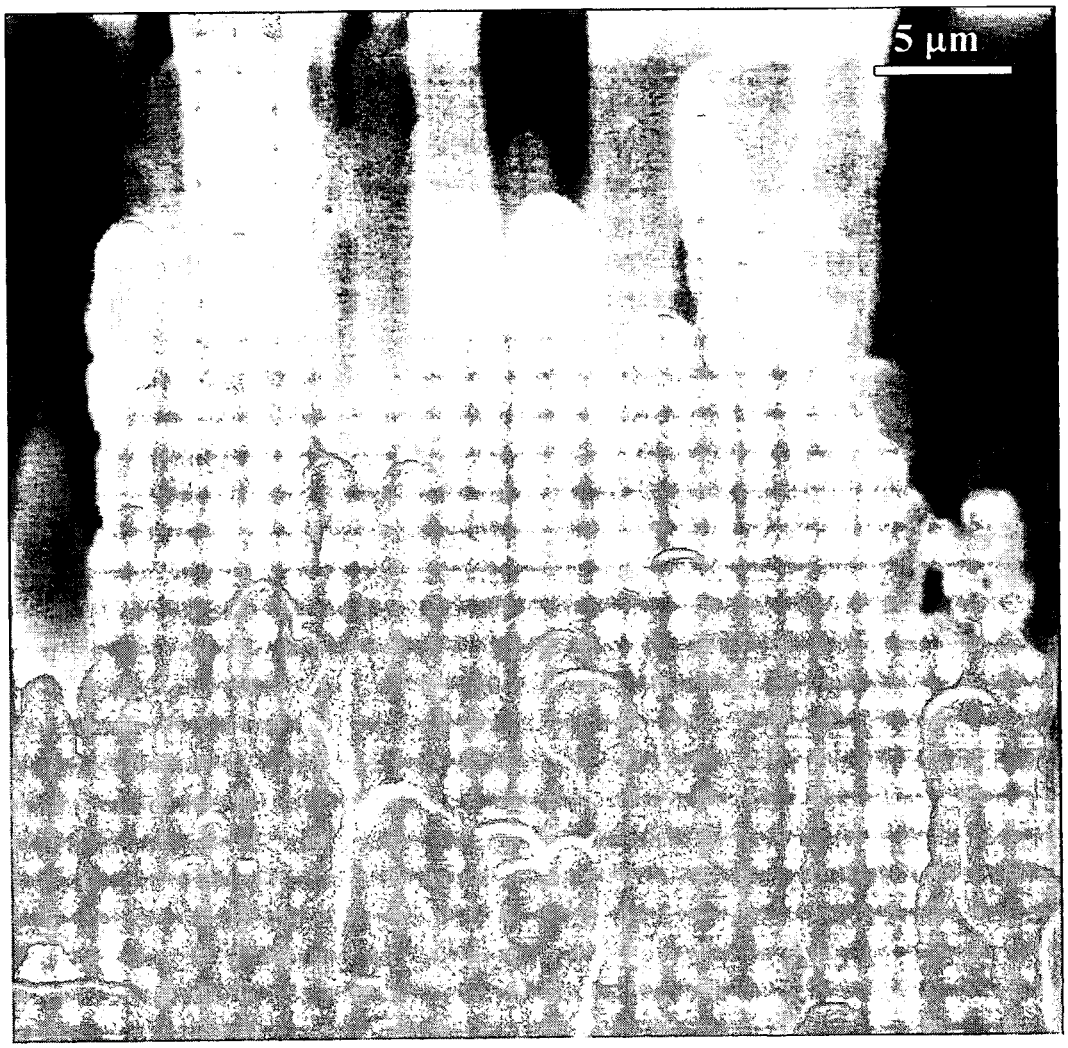
FIG. 2 shows silicon nanofibers for short time scale growth (initial one hour).

FIG. 2 shows silicon nanofibers for short time scale growth (initial one hour).

Figure 3:
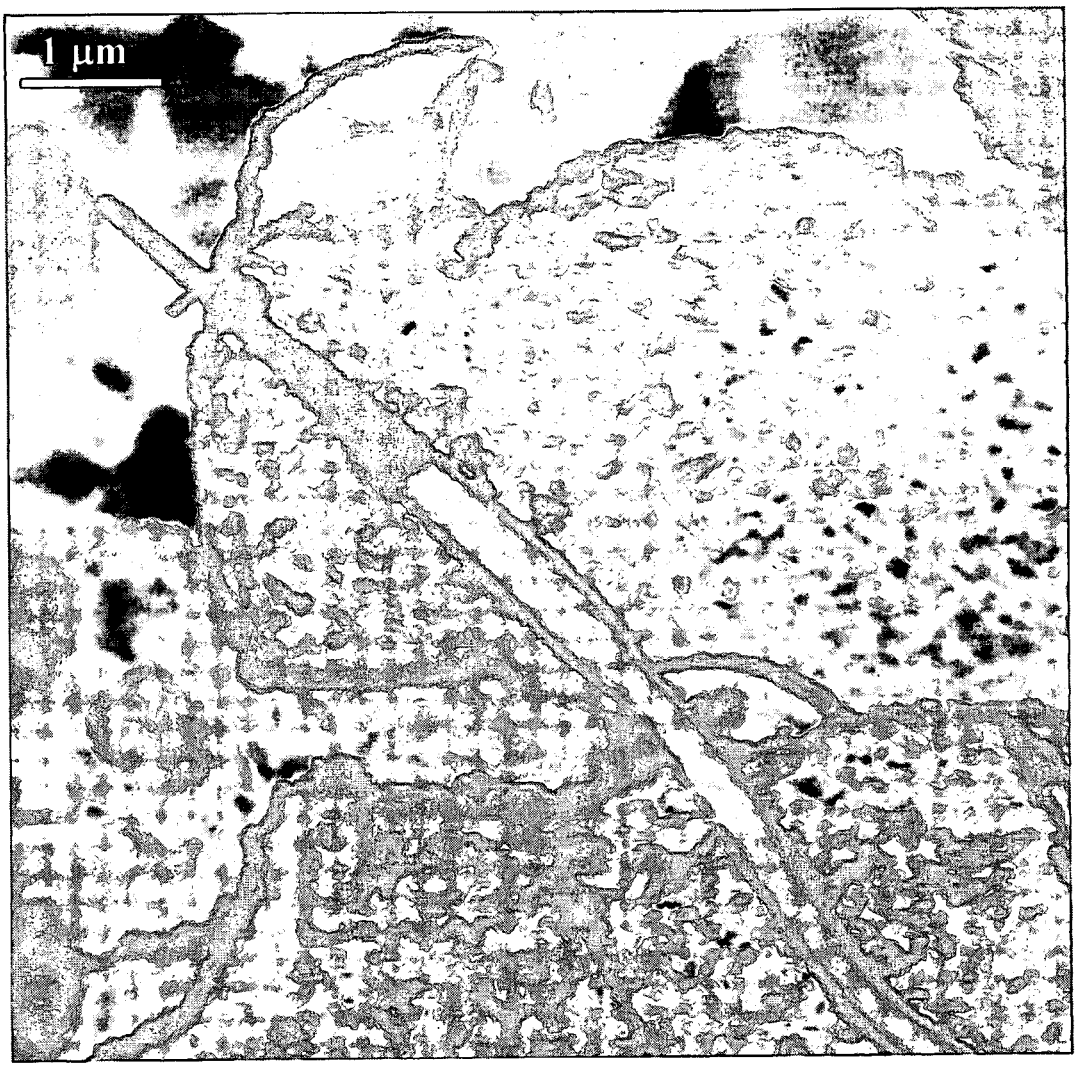
FIG. 3 shows a silicon nanoneedle after a growth experiment for 3 hours.

FIG. 3 shows a silicon nanoneedle. The H2/N2 ratio was kept at 0.008. Chamber pressure was 40 Torr and 800 W of microwave power was applied.

Figure 4:
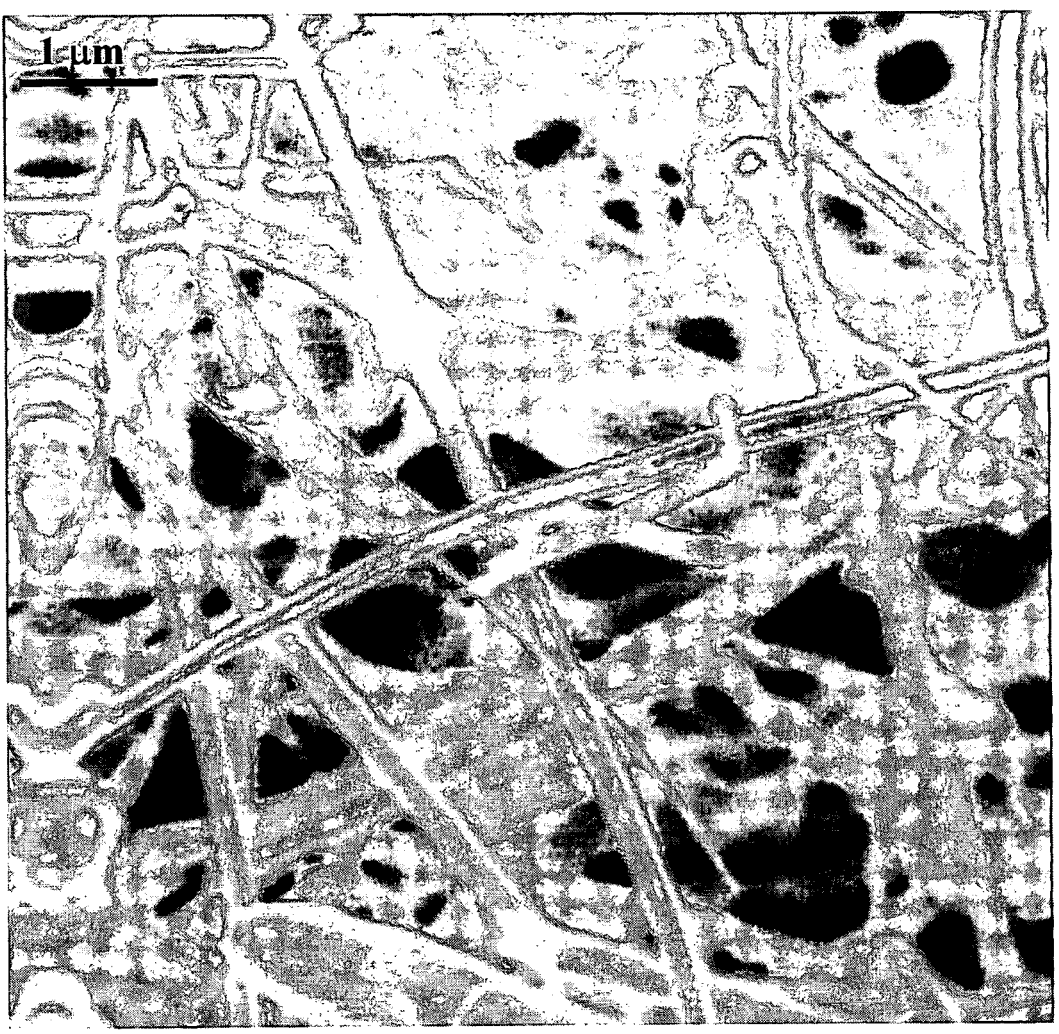
FIG. 4 shows a web of fibers grown for a longer time, five hours.

FIG. 4 shows a web of fibers grown for a longer time of five hours. Due to the long growth duration, the grown wires were very long and intermingled. The length of the synthesized nanowires depends solely on the duration of the experiment.

Figure 5:
FIG. 5 shows a multitude of oriented silicon fibers.

FIG. 5 shows a plurality of oriented silicon fibers. These fibers were grown with H2/N2 ratio of 0.0075, pressure of 50 Torr and 1000 W of microwave power.

Figure 7:
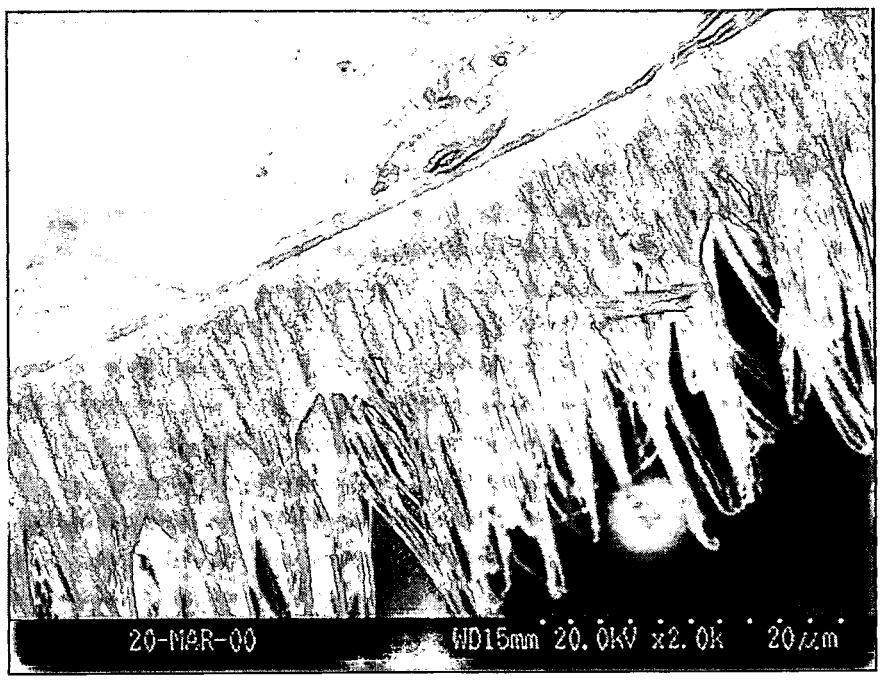
FIG. 7 shows silicon nanowires grown using our Ga mediated VLS process.

FIG. 6 shows a ASTeX model 5010 bell jar reactor chamber equipped with an ASTeX model 2115 1500 W microwave power generator FIG. 7 shows silicon nanowires (~10 nm diameter) growing as a plurality of filaments after a growth experiment for 8 hours with a microwave power of 600 W, 30 torr pressure, and a total flow rate of 100 sccm of hydrogen. The micrograph was taken using a Hitachi S900 Field Emission Scanning Electron Microscope at an acceleration voltage of 2 kV and a magnification of ×60 K.

Figure 8:
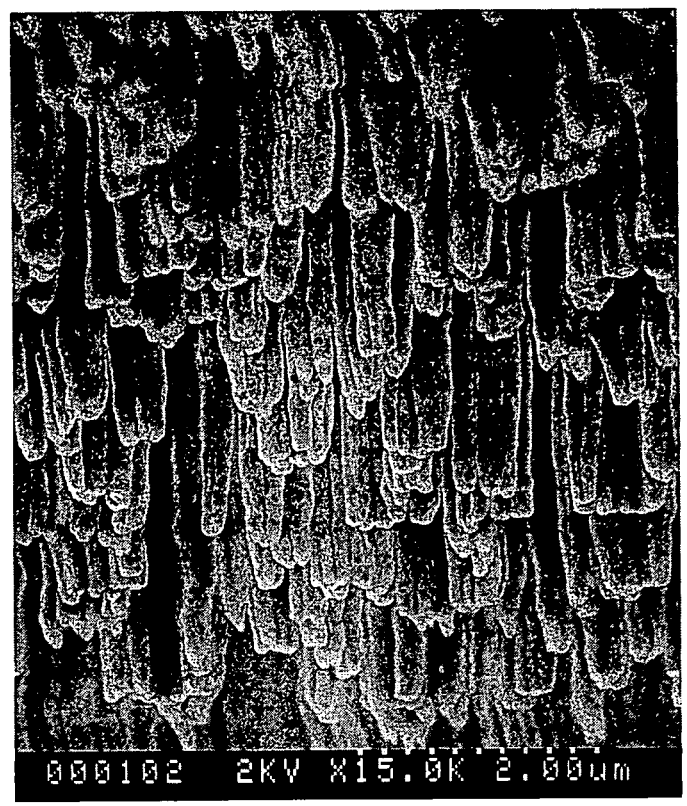
FIG. 8 shows silicon nanorods 150 nm thick, grown out of large gallium pool.

FIG. 8 shows oriented silicon nanorods 150 nm in diameter, grown out of large gallium pool after a growth experiment for 5 hours with a microwave power of 900 W, 50 torr pressure, and a total flow rate of ~100 sccm of hydrogen with inlet H2/N2 ratio of 0.0075.

Figure 9:
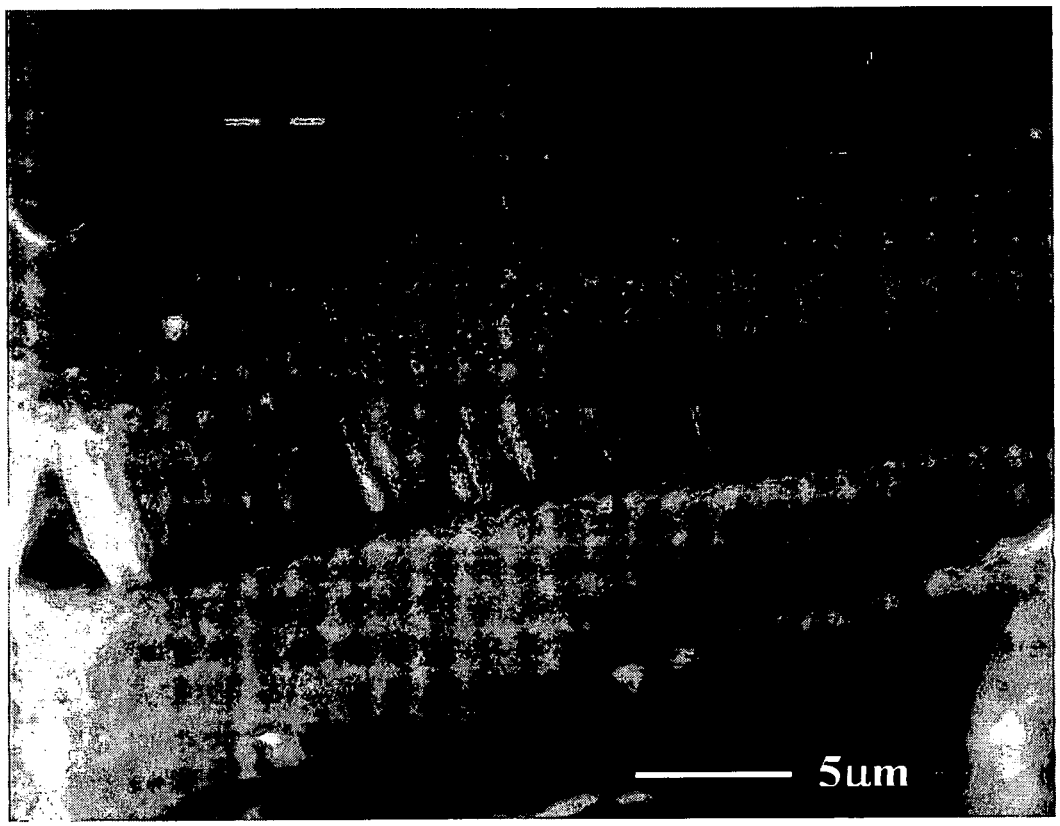
FIG. 9 illustrates oriented growth of silicon nanowires ~100 nm thick, using pools of gallium melt.

FIG. 9 illustrates oriented growth of silicon nanowires ~100 nm in diameter, using large pools of gallium melt. These nanowires were grown for 5 hours with microwave power of 850 W, Pressure of 50 torr, and inlet H2/N2 ratio of 0.0075.

Figure 10:
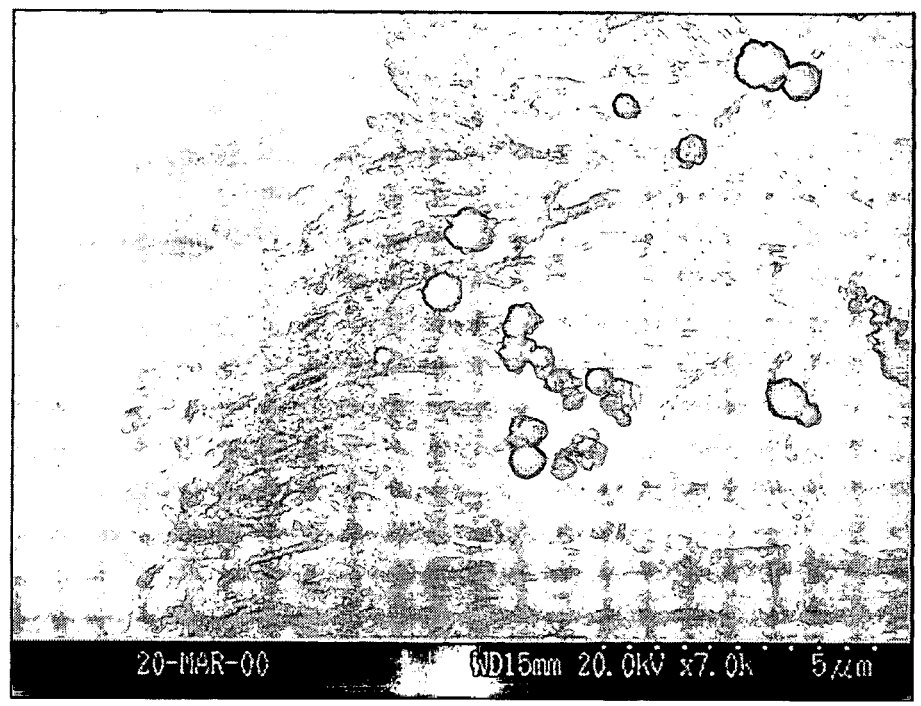
FIG. 10 shows bulk quantities of silicon nanowires produced after a growth experiment for 5 hours.

FIG. 10 shows profuse quantities of silicon nanowires produced after a growth experiment for 5 hours with microwave power of 900 W, pressure of 50 torr, and a total flow rate of 100 sccm of hydrogen. The nanowires were imaged using a Hitachi 3200N scanning electron microscope at an acceleration voltage of 20 kV and a magnification of ×7 k.

Figure 11:
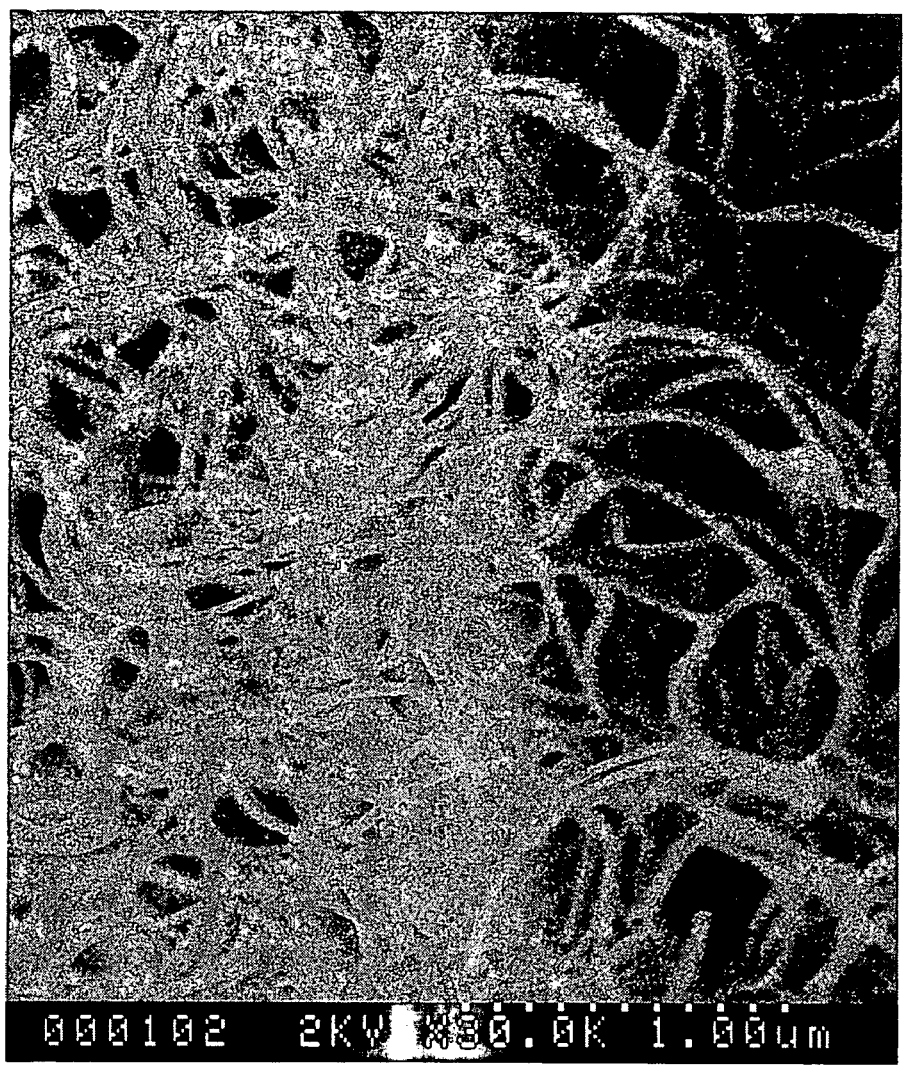
FIG. 11 shows spaghetti like wires grown out of a different gallium droplet on the same substrate as processed in FIG. 10.

FIG. 11 shows a spaghetti like collection of wires grown out of a different gallium droplet on the same sample in FIG. 10.

Figure 12:
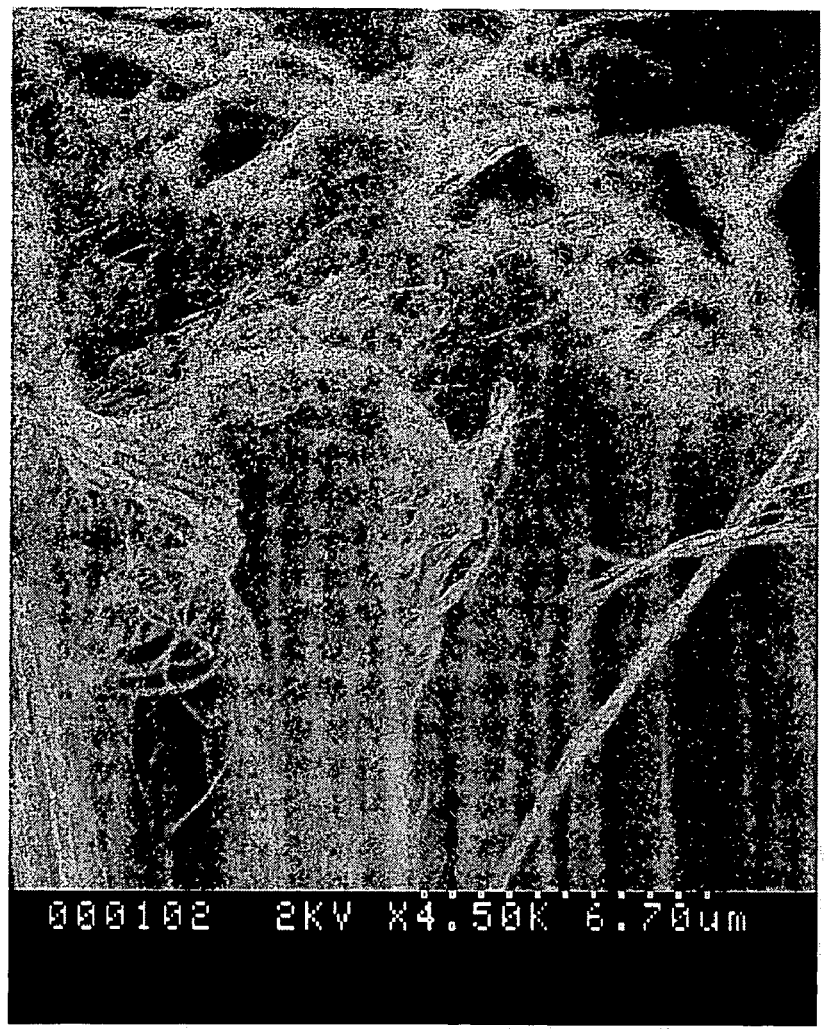
FIG. 12 shows bulk quantities of very straight silicon nanowires.

FIG. 12 shows bulk quantities of very straight silicon nanofilaments grown for 6 hours with 1000 W microwave power, 50 torr pressure, and a total gas flow rate of about 100 sccm with inlet H2/N2 ratio of 0.0075.

Figure 13:
FIG. 13 shows a higher magnification scanning electron microscope, ("SEM"), image of the wires grown out of a different droplet on the same substrate as in FIG. 12.

FIG. 13 shows a higher magnification Scanning Electron Microscope (SEM) image of the wires grown out of a different droplet on the same substrate as in FIG. 12.

Figure 14:
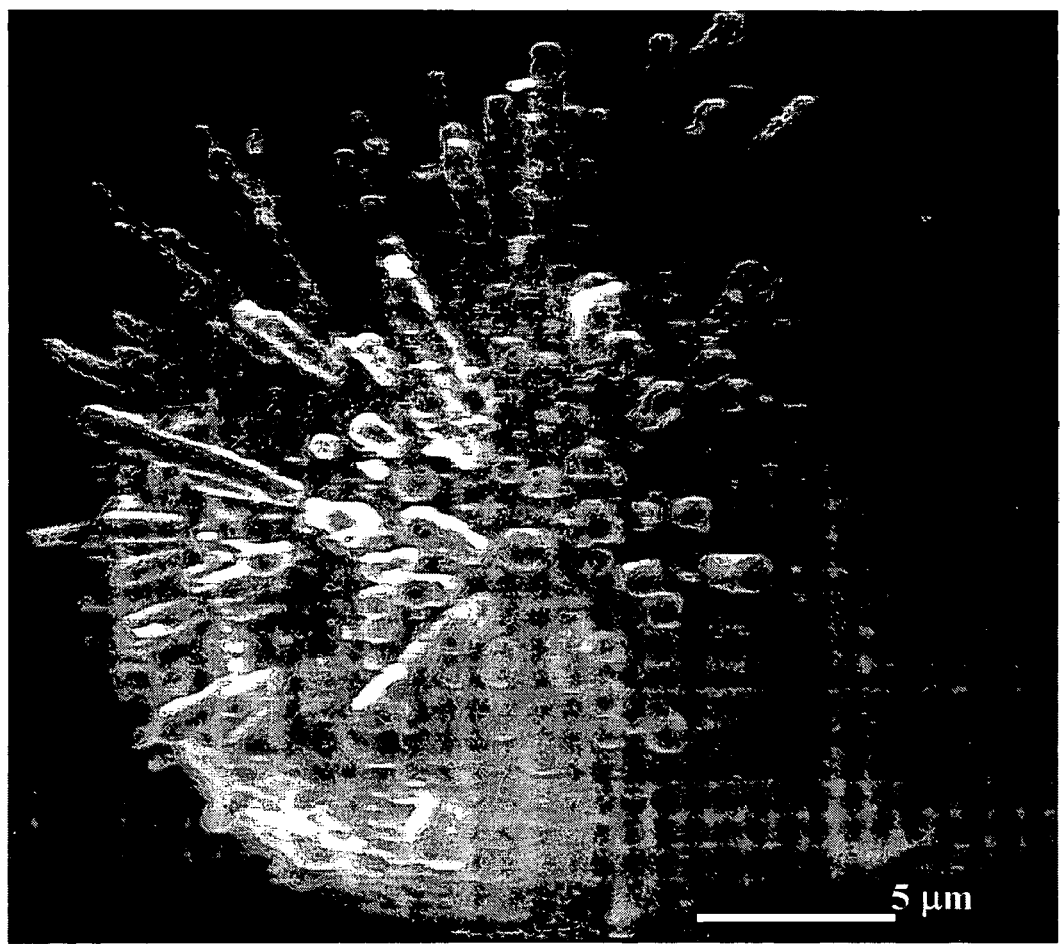
FIG. 14 demonstrates nucleation of multiple sub-micron and nano-scale, silicon wires from a single gallium droplet.

FIG. 14 demonstrates the fact that multiple nanowires can nucleate and grow out of a large gallium pool in our technique, unlike in traditional VLS techniques, where one has to create nanometer sized catalyst particles to enable growth of a single nanowire from a single catalyst particle. Multiple sub-micron and nano-scale silicon wires are shown to grow out of a single large gallium droplet. These fibers were grown for 3 hours with 1000 W microwave power, 30 torr, and H2/N2 ratio of 0.0025.

Figure 15:
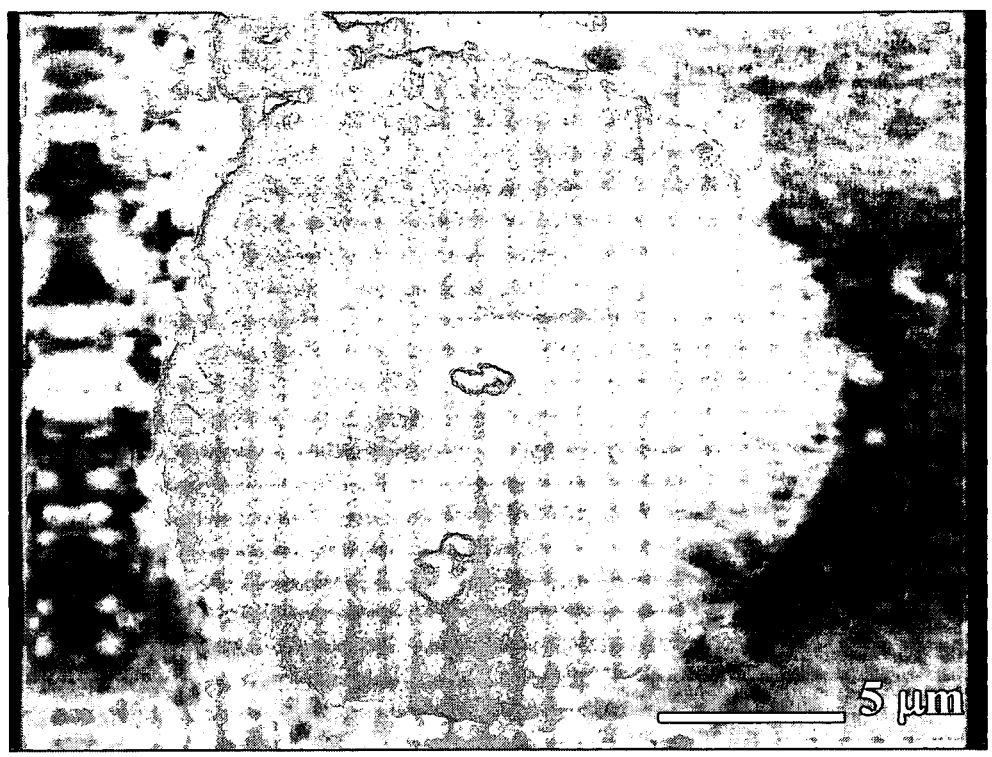
FIG. 15 shows SEM image of multiple nanowires 50 nm thick growing out of a single large gallium droplet.

FIG. 15 shows SEM image of multiple nanowires 50 nm in diameter growing out of a single large gallium droplet. These fibers were grown for 7 hours with a microwave power of 950 W, pressure of 50 torr and H2/N2 ratio of 0.0095.

Figure 16:
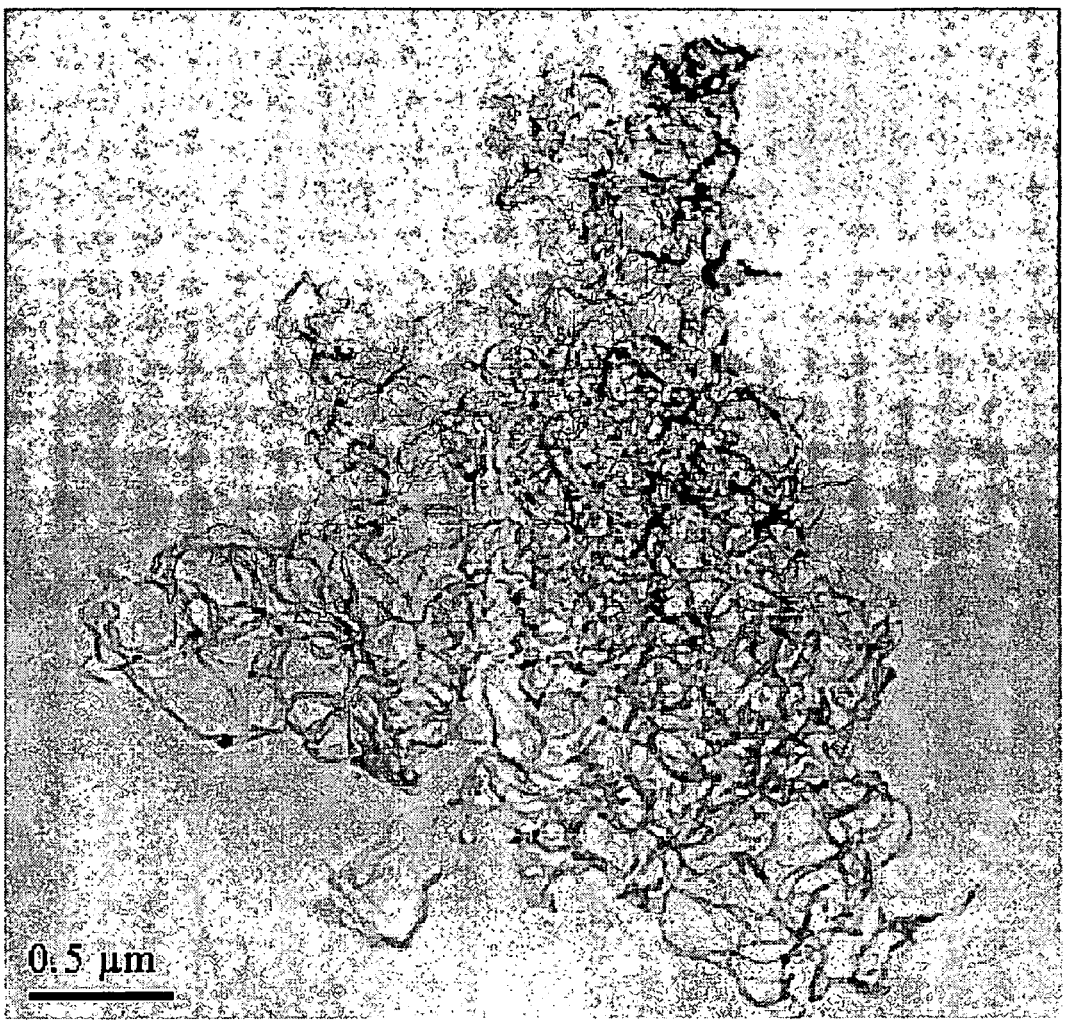
FIG. 16 shows a low magnification Transmission Electron Microscope image of a web of silicon nanowires grown under the same conditions as the sample shown in FIG. 7.
Figure 17:
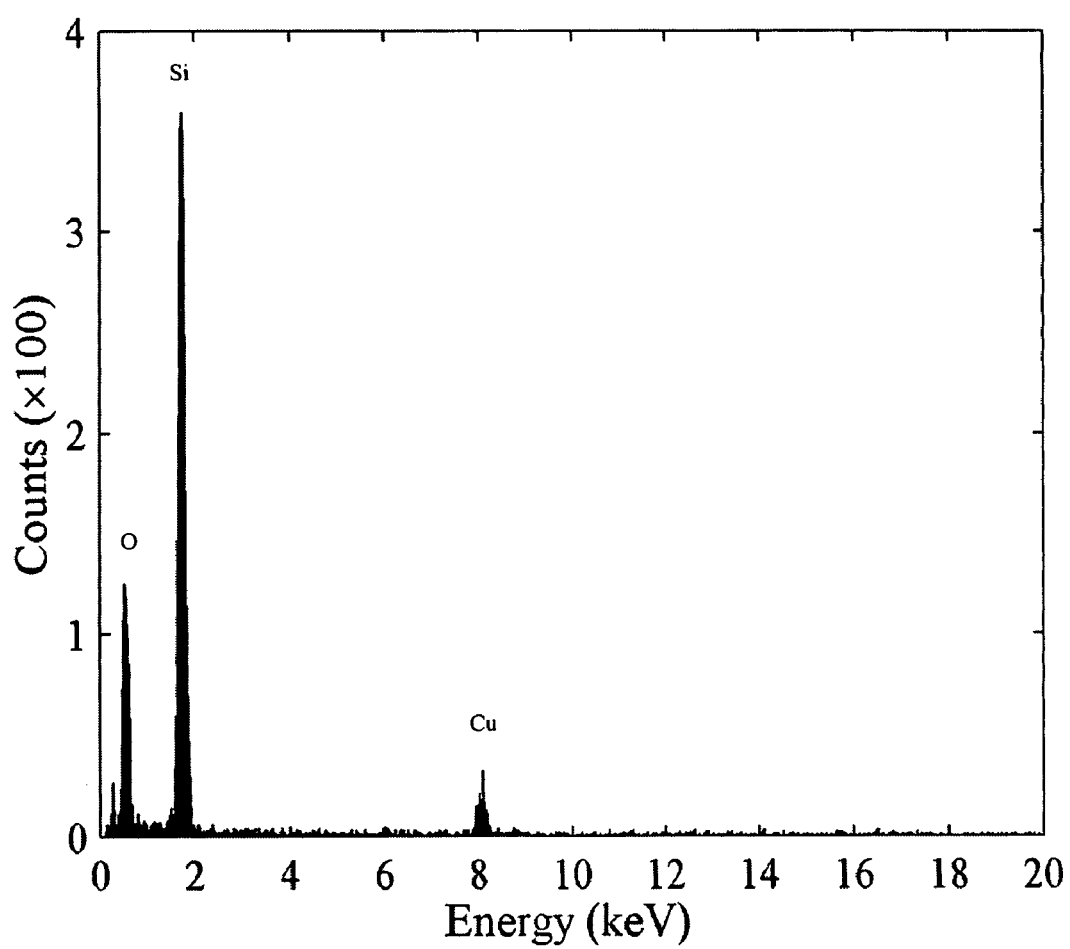
FIG. 17 shows a typical Energy Dispersive Spectroscopy spectrum of a single nanowire confirming the nanowires to be composed of silicon which is covered with some surface native oxide.

FIG. 16 shows a web of silicon nanowires grown under the same conditions as the sample shown in FIG. 7. These nanowires imaged using a EOL 2000 FX Transmission Electron Microscope at an acceleration voltage of 200 kV and a magnification of ×300 k. The elemental composition of the fibrous structures was determined using Energy Dispersive Spectroscopy (EDX), a feature in the JEOL 2000FX microscope. FIG. 17 shows a representative EDX spectrum of an individual nanowire shown in FIG. 16. The nanowires are composed of silicon with some surface oxidation. The copper peak appeared due to the copper grid material.

Figure 18:
FIG. 18 shows a High Resolution Transmission Electron Microscopy (HRTEM) image of a 4 nm thick silicon nanowires.
Figure 19:
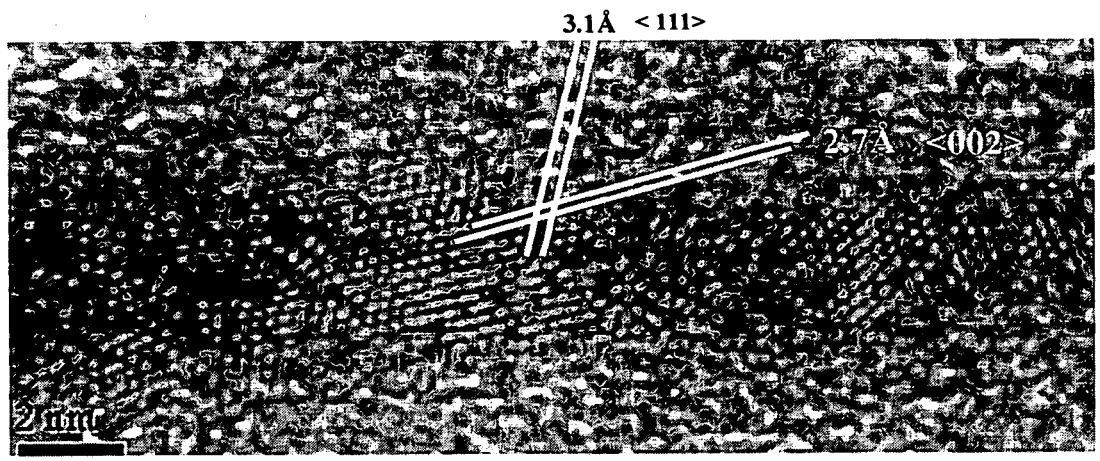
FIG. 19 shows a HRTEM image of a 4 nm thick silicon nanowires.

FIGS. 18 and 19 represent high resolution Transmission Electron Microscopy images of two different silicon nanowires about 4 nm in diameter. The fringes in these micrographs represent lattice planes in the nanowires. The lattice spacing was measured using the Digital Micrograph software, which matched the values for bulk silicon lattice spacings. Silicon nanowires were also synthesized using large gallium droplets exposed to a microwave plasma containing silane and hydrogen without the need for solid silicon substrate. Nanowires were synthesized using molten gallium droplets placed on quartz and pyrolytic boron nitride substrates.

Example 2

Bulk Synthesis of Gallium Oxide Fibers

Gallium oxide fibers can be grown using the above plasma mediated technique. A quartz substrate (2 cm×2 cm) was prepared by ultra-sonication in isopropyl alcohol. Droplets of gallium metal at 70° C. were applied to form a film with a thickness of approximately 100 microns. The hydrogen flow rate was set to 100 sccm. The pressure in the reactor was set to 40 Torr. Microwaves at 2.45 Ghz were used to ionize the hydrogen gas. The input microwave power was 700 W. The experiments were done in an ASTeX model 5010 bell jar reactor chamber equipped with an ASTeX model 2115 1500 W microwave power generator. 0.6 sccm of oxygen were introduced into the hydrogen plasma. The reaction was carried out for four hours. Graphite blocks were used as substrate stage. After the growth experiments, the quartz substrate covered with a whitish mass was observed using a scanning electron microscope (SEM). FIGS. 20 through 25 show micrographs of gallium oxide fibers of various thickness and length.

Figure 20:
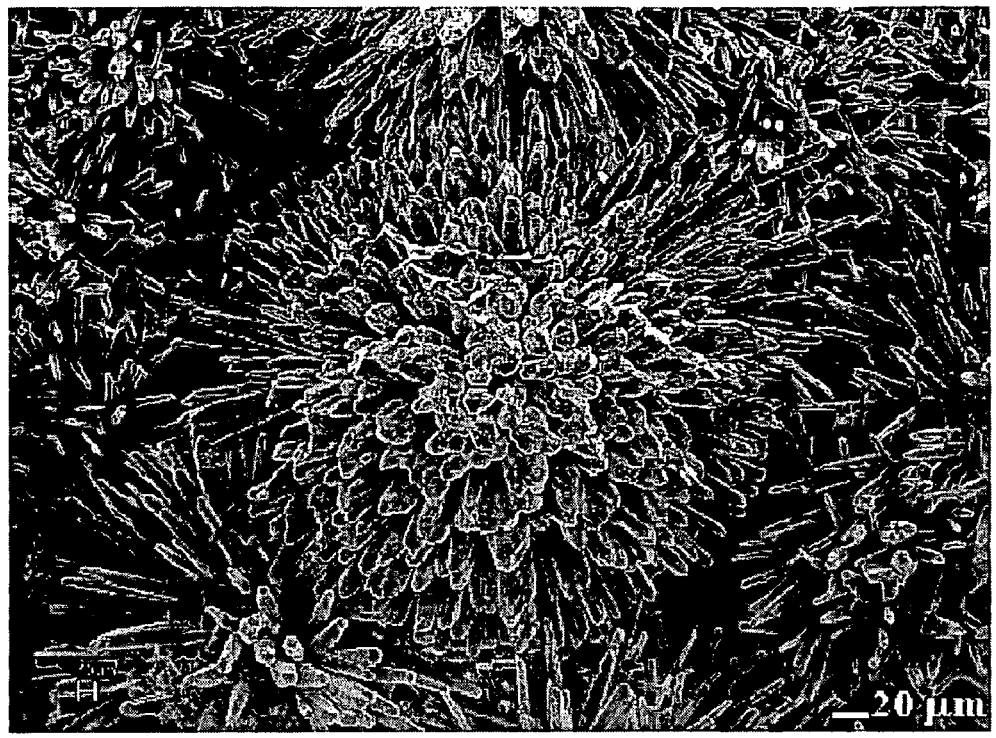
FIG. 20 shows multiple gallium oxide rods growing out of a large gallium pool with growth conditions of 4 hour growth duration, 1000 W microwave power, 30 Torr pressure, 100 sccm of hydrogen, and 0.6 sccm of oxygen in the inlet stream.
Figure 21:
FIG. 21 shows highly faceted gallium oxide fibers on the same sample shown in FIG. 20.
Figure 22:
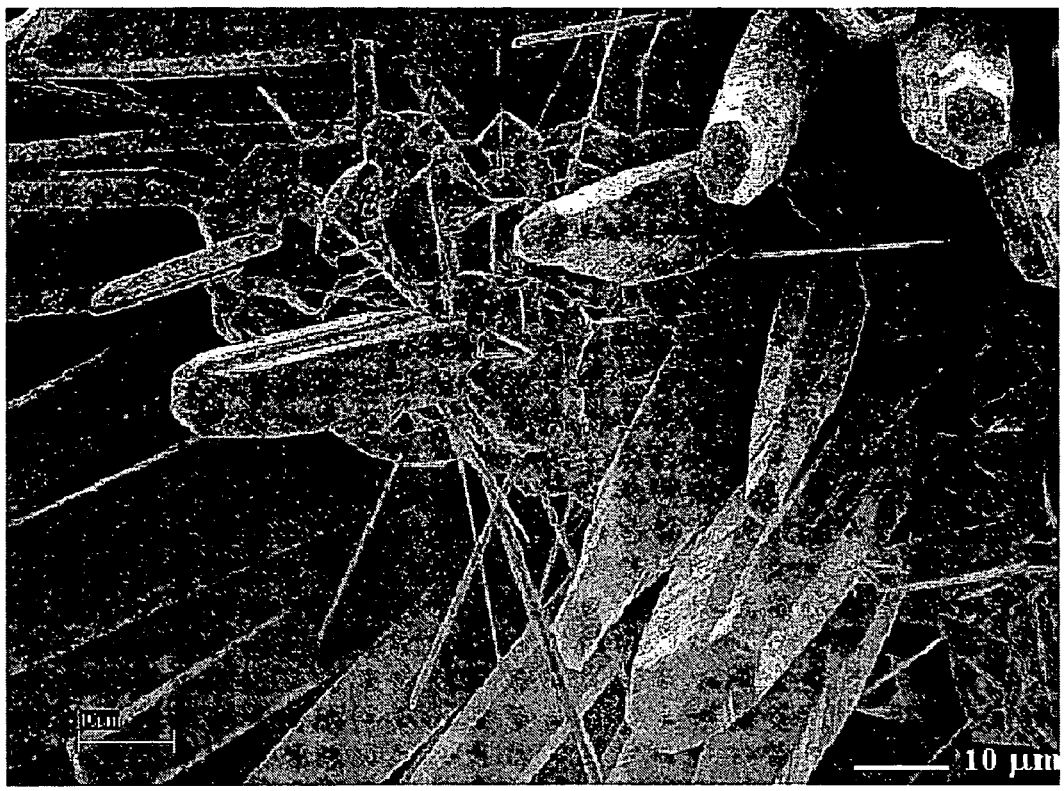
FIG. 22 shows gallium oxide sub-micron thick fibers in addition to the micron-scale rods in the same sample shown in FIG. 20.
Figure 23:
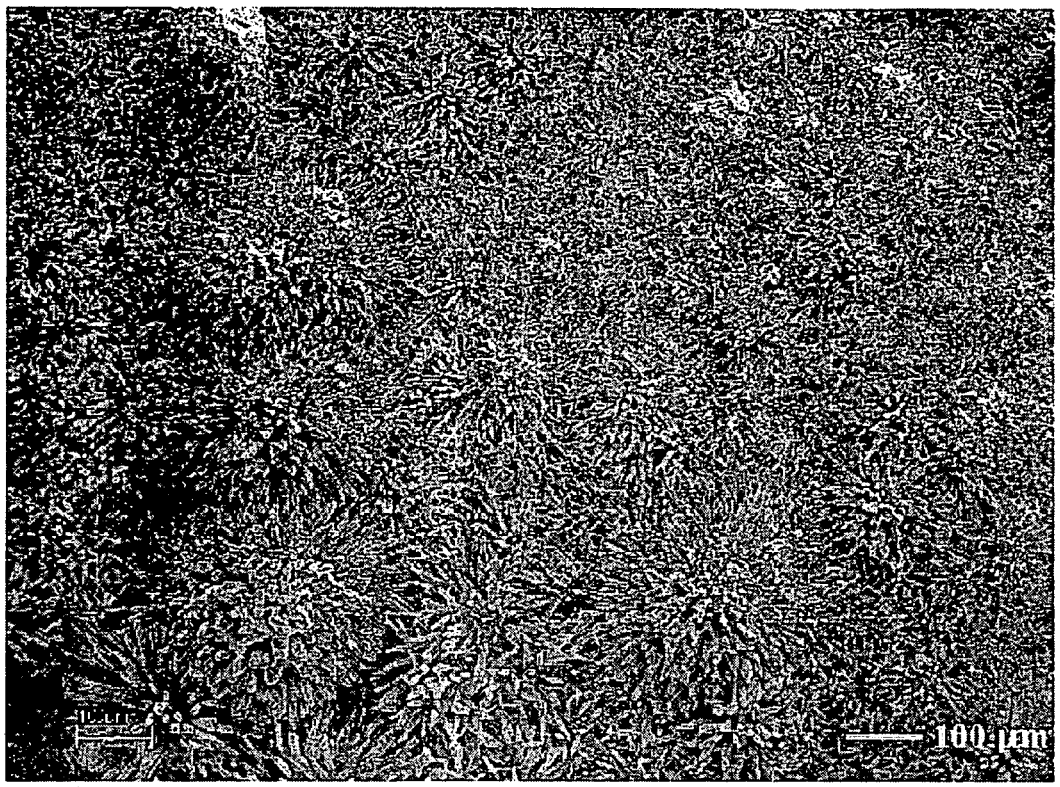
FIG. 23 shows a zoomed-out view of the quartz substrate wherein multiple fibers have been grown out of a large gallium pool.
Figure 24:
FIG. 24 shows gallium oxide nanowires about 100 nm thick from a different region on the same sample as shown in FIG. 20.
Figure 25:
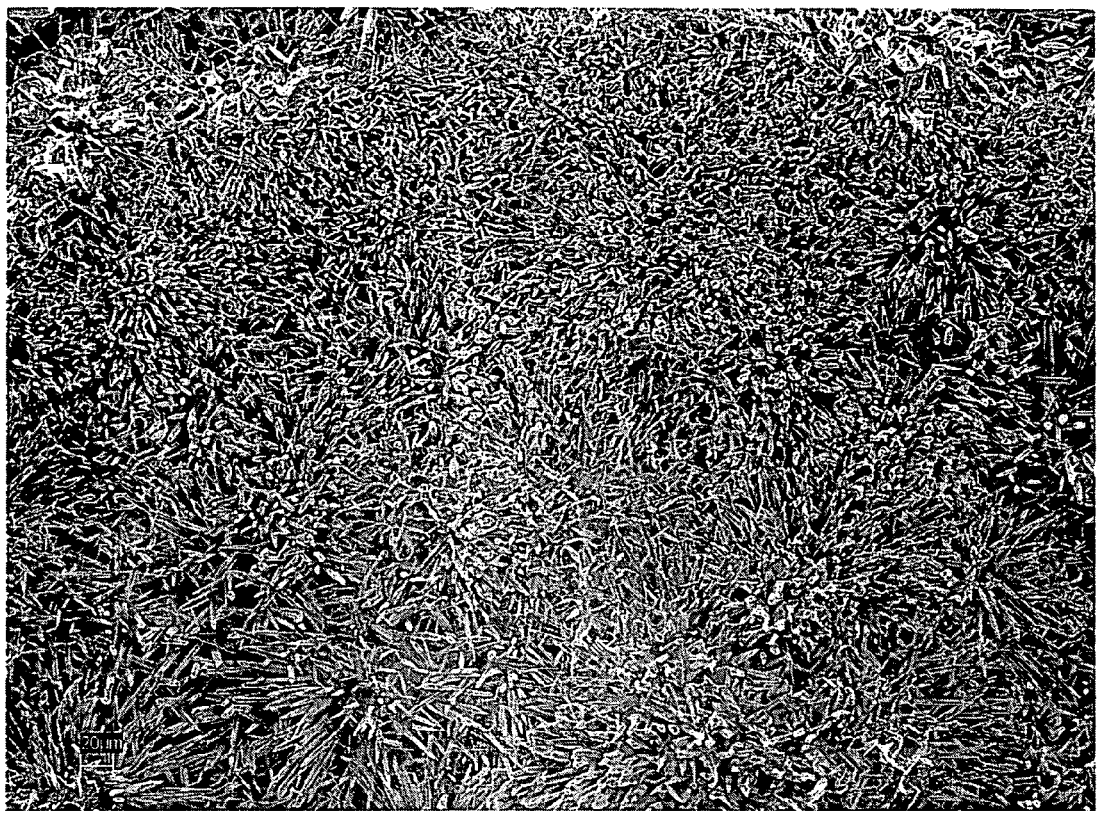
FIG. 25 is another illustration of multiple nucleation and fiber growth.
Figure 26:
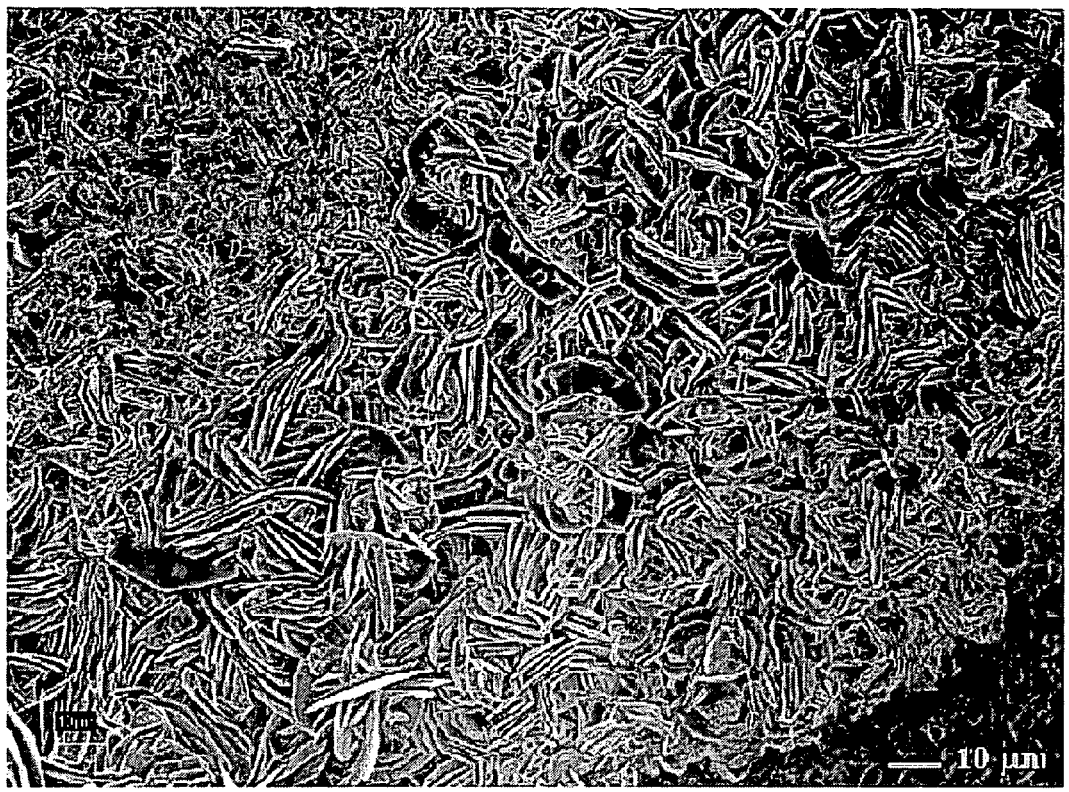
FIG. 26 shows scanning electron microscopy images of gallium oxide platelets and crystals obtained in addition to the one-dimensional structures after a growth experiment under the same conditions as for sample in FIG. 20 at 10 micrometers.
Figure 27:
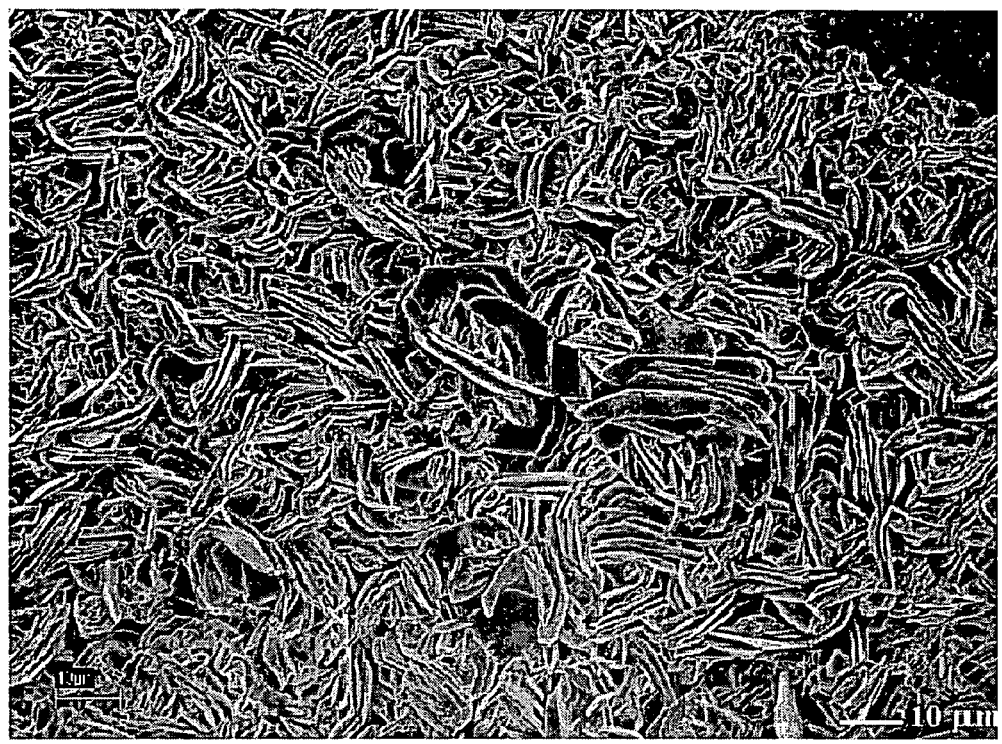
FIG. 27 shows another scanning electron microscopy images of gallium oxide platelets and crystals obtained in addition to the one-dimensional structures after a growth experiment under the same conditions as for sample in FIG. 20 at 10 micrometers.
Figure 28:
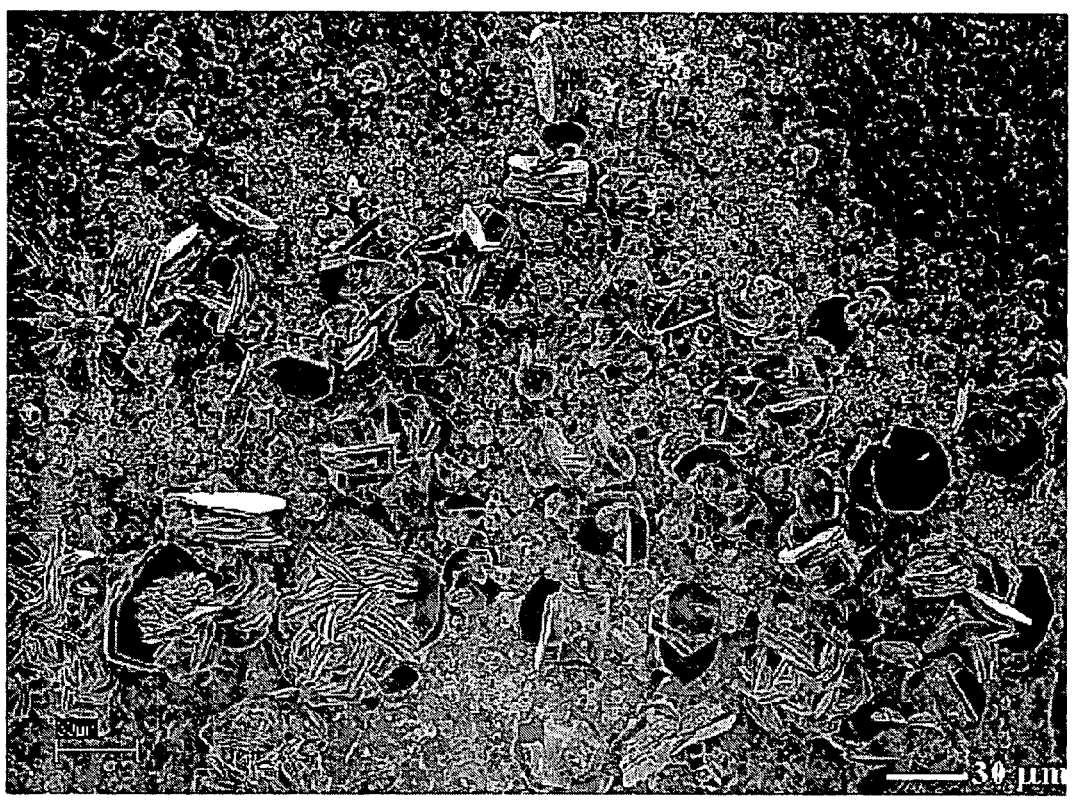
FIG. 28 shows scanning electron microscopy images of gallium oxide platelets and crystals obtained in addition to the one-dimensional structures after a growth experiment under the same conditions as for sample in FIG. 20 at 30 micrometers.
Figure 29:
FIG. 29 shows scanning electron microscopy images of gallium oxide platelets and crystals obtained in addition to the one-dimensional structures after a growth experiment under the same conditions as for sample in FIG. 20 at 5 micrometers.

FIG. 20 shows multiple gallium oxide rods growing out of a large gallium pool. The fibers are very well faceted and were grown for 4 hours with 1000 W microwave power, 30 Torr pressure, 100 sccm of hydrogen, and 0.6 sccm of oxygen in the inlet stream. FIG. 21 shows highly faceted gallium oxide fibers on the same sample shown in FIG. 20. The micrographs were taken using a LEO 1430 Scanning Electron Microscope at an acceleration voltage of 20 kV. FIG. 22 shows gallium oxide sub-micron thick fibers in addition to the micron-scale rods in the same sample mentioned above. FIG. 23 shows an overall zoomed out view of the quartz substrate, demonstrating the fact that multiple fibers can nucleate and grow out of a large gallium pool using our technique. FIG. 24 shows gallium oxide nanowires about 100 nm thick from a different region on the same sample as shown in FIG. 20. FIG. 25 is another illustration of multiple nucleation and fiber growth.

In addition to the one-dimensional structures, gallium oxide platelets of about 100-200 nm thick are shown in FIGS. 26 through 29 which show scanning electron microscopy images of gallium oxide platelets and crystals obtained in addition to the one-dimensional structures after a growth experiment under the same conditions as for sample in FIG. 20. Growth of gallium oxide can also be achieved with a range of abovementioned process parameters and with different substrate materials.

Gallium oxide fibers were also synthesized with gallium droplets spread on other substrates, such as pyrolytic boron nitride, alumina, and glassy carbon. In addition to different fractions of $O_2/H_2$ being used, fractions of methane and nitrogen were also introduced into the plasma and synthesis of gallium oxide fibers was obtained.

Example 3

Synthesis of Carbon Nanofibers

Figure 30:
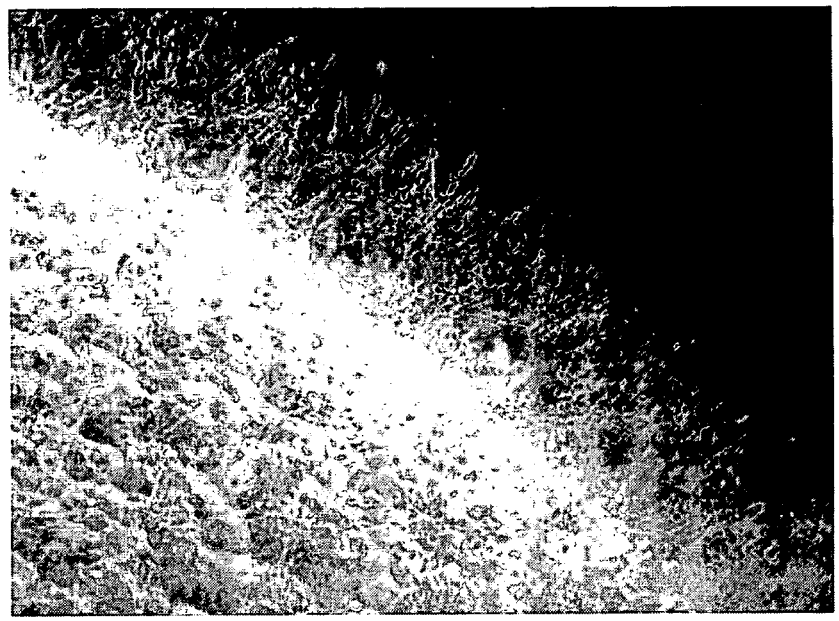
FIG. 30 shows multiple carbon filaments growing out of a large gallium droplet.
Figure 31:
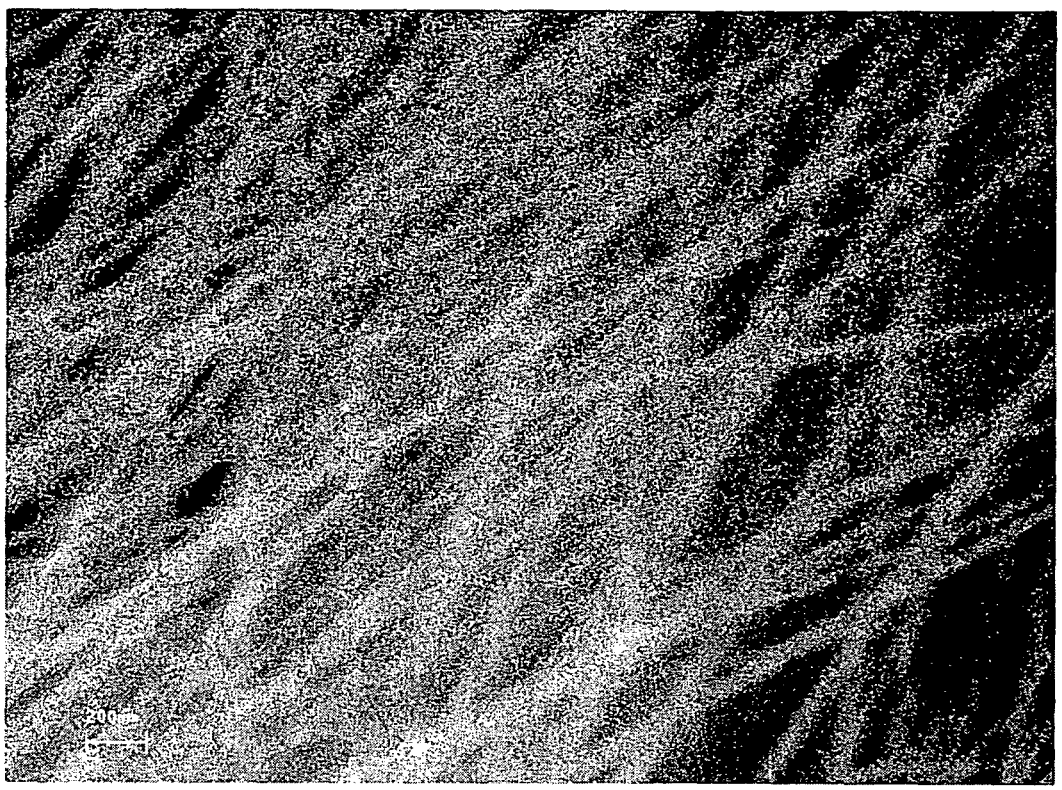
FIG. 31 shows a higher magnification image of approximately 50 nm thick nanofilaments.
Figure 32:
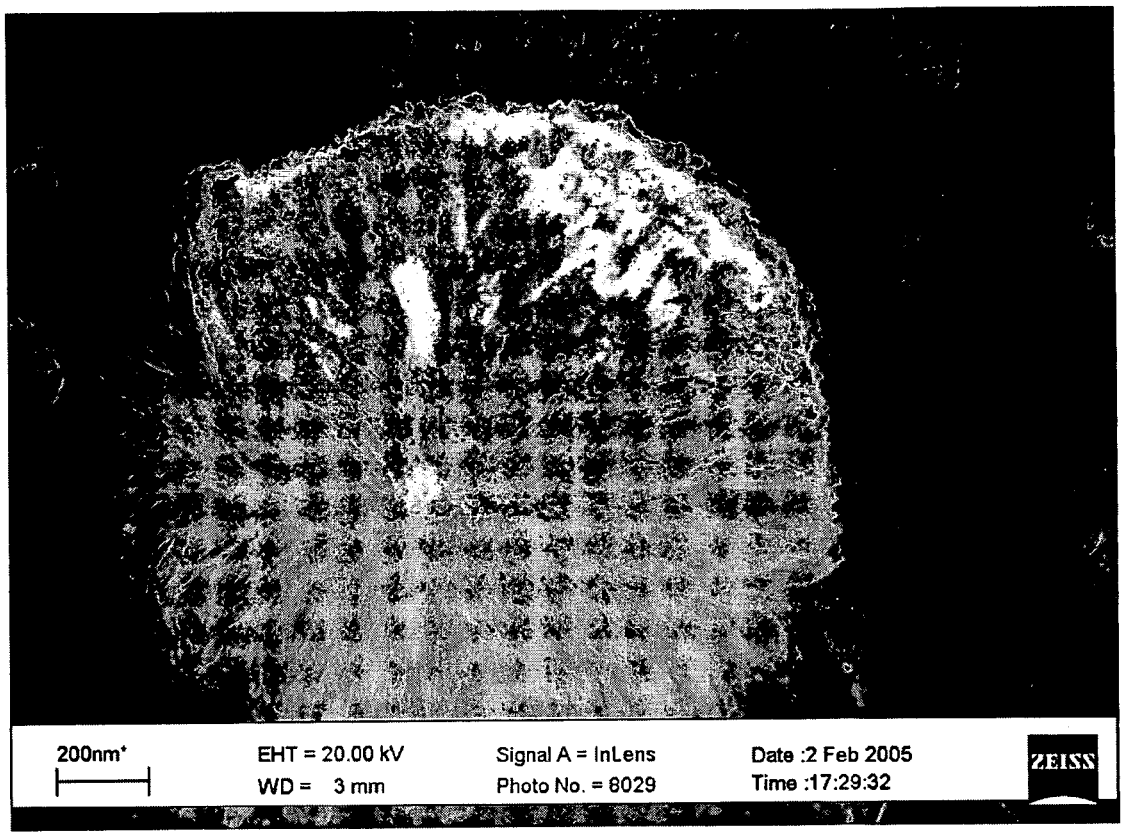
FIG. 32 shows a micrograph of a carbon nanofiber.
Figure 33:
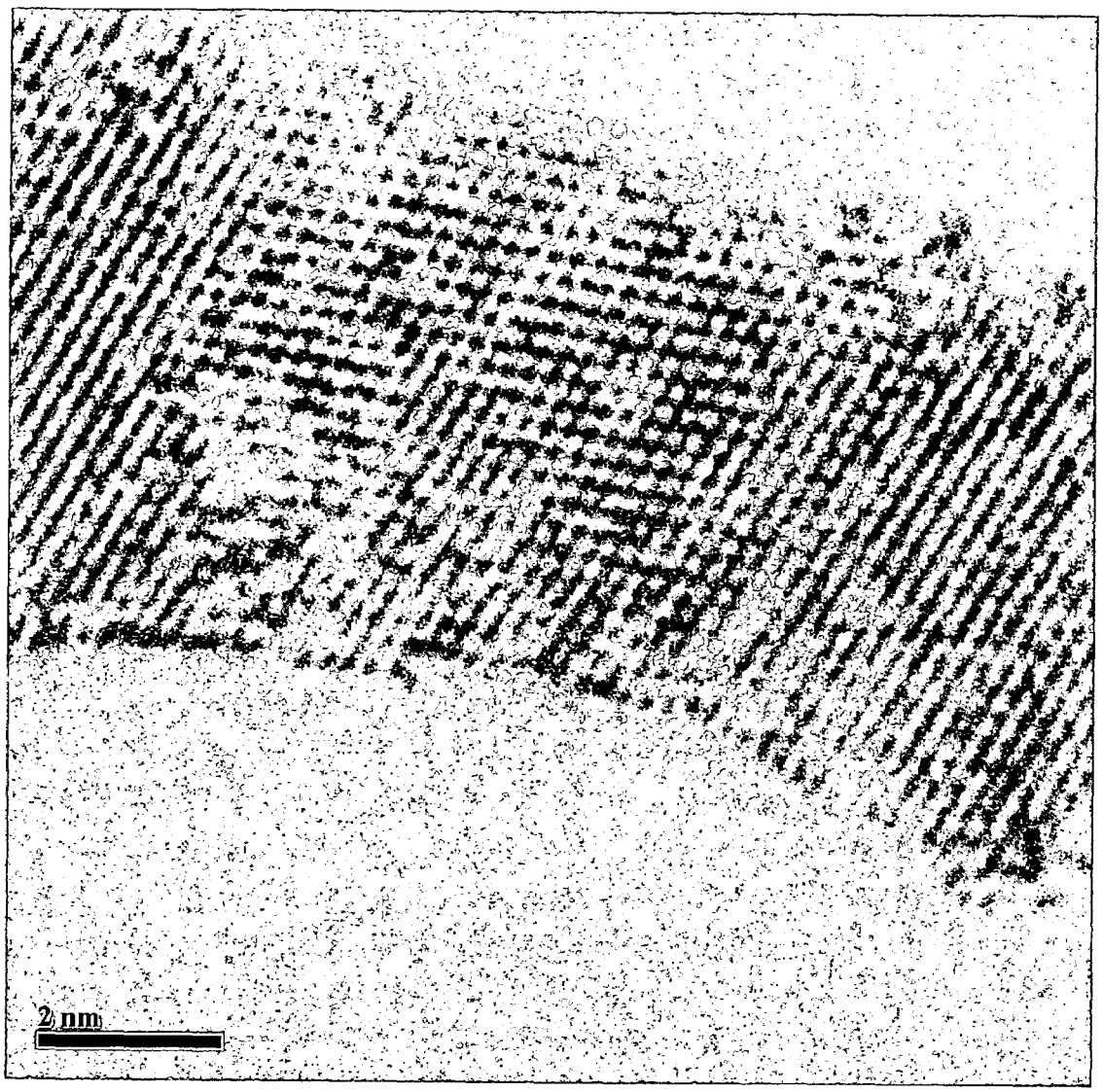
FIG. 33 shows a micrograph of a carbon nanofiber.

Carbon nanofibers were grown using the above plasma-mediated technique. A pyrolytic boron nitride substrate (~1 cm×1 cm) was prepared by ultra-sonication in isopropyl alcohol. The substrate was covered with molten gallium droplets. The hydrogen flow rate was set to 100 sccm. The pressure in the reactor was set to 40 Torr. Microwaves at 2.45 Ghz were used to ionize the hydrogen gas. The input microwave power was 700 W. The experiments were done in an ASTeX model 5010 bell jar reactor chamber equipped with an ASTeX model 2115 1500 W microwave power generator in as shown in FIG. 6. Two (2.0) sccm of methane were introduced into the hydrogen plasma. The reaction was carried out for four hours. Graphite blocks were used as substrate stage. After the growth experiments, the quartz substrate covered with a grey mass was observed using a scanning electron microscope (SEM). FIGS. 30 through 33 show micrographs of carbon nanofibers of various thickness and length with the following growth conditions: microwave power of 700 W, pressure of 40 torr, 4 hr duration, 100 sccm of hydrogen and 2 sccm of methane in the plasma. Again, these process parameters can be varied and synthesis of carbon nanowires obtained. FIG. 30 shows multiple carbon filaments growing out of a large gallium droplet. The fibers illustrated in FIG. 31 show a higher magnification image of approximately 50 nm thick nanofilaments.

Example 4

Synthesis of Germanium Fibers

Figure 34:
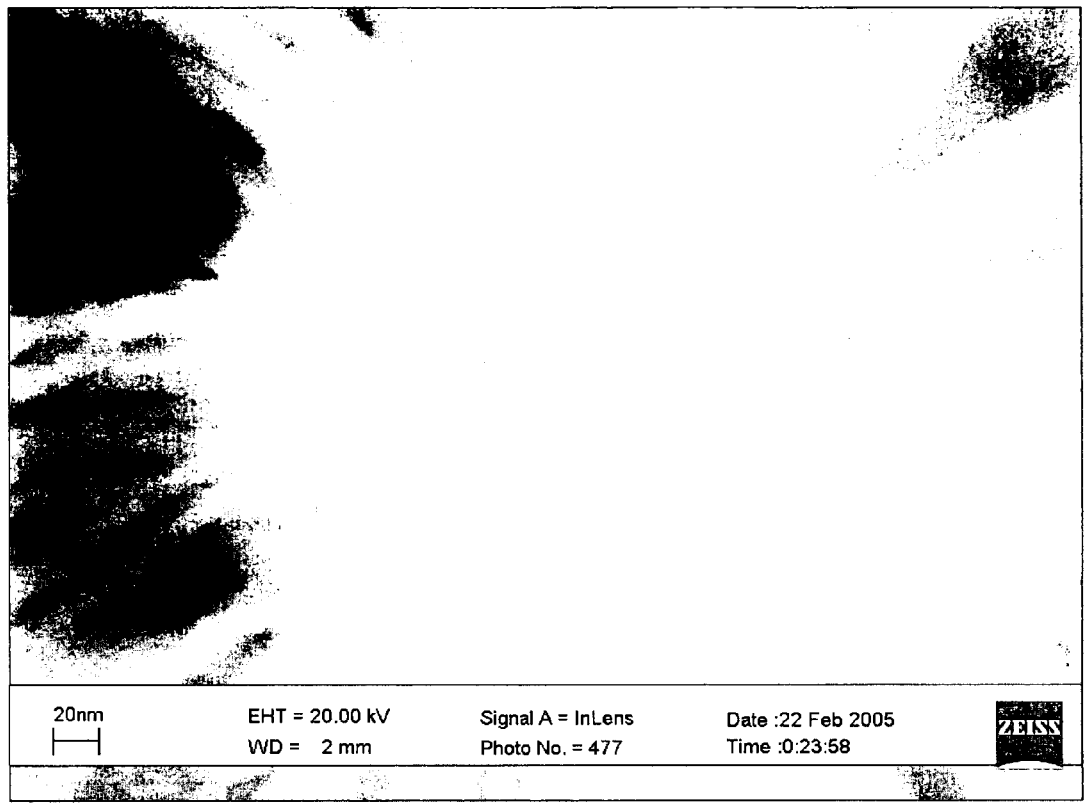
FIG. 34 shows a. SEM image showing sub-5 nm size nanowires growing out of Ga droplets with Ga droplets placed on germanium substrate.

Germanium fibers can be grown using the above technique by using either germanium substrate or using germane in the vapor phase. Specific experiments were performed using Germanium substrate coated gallium using 10% hydrogen in nitrogen microwave plasma with 500 W power at 30 torr pressure. FIG. 34 shows an SEM image showing sub-5 nm size nanowires growing out of Ga droplets with Ga droplets placed on germanium substrate at 30 torr pressure, 500 W MW power, 10 sccm H2, 100 sccm nitrogen.

Example 5

Synthesis of Silicon Nitride Fibers and Whiskers

Figure 35:
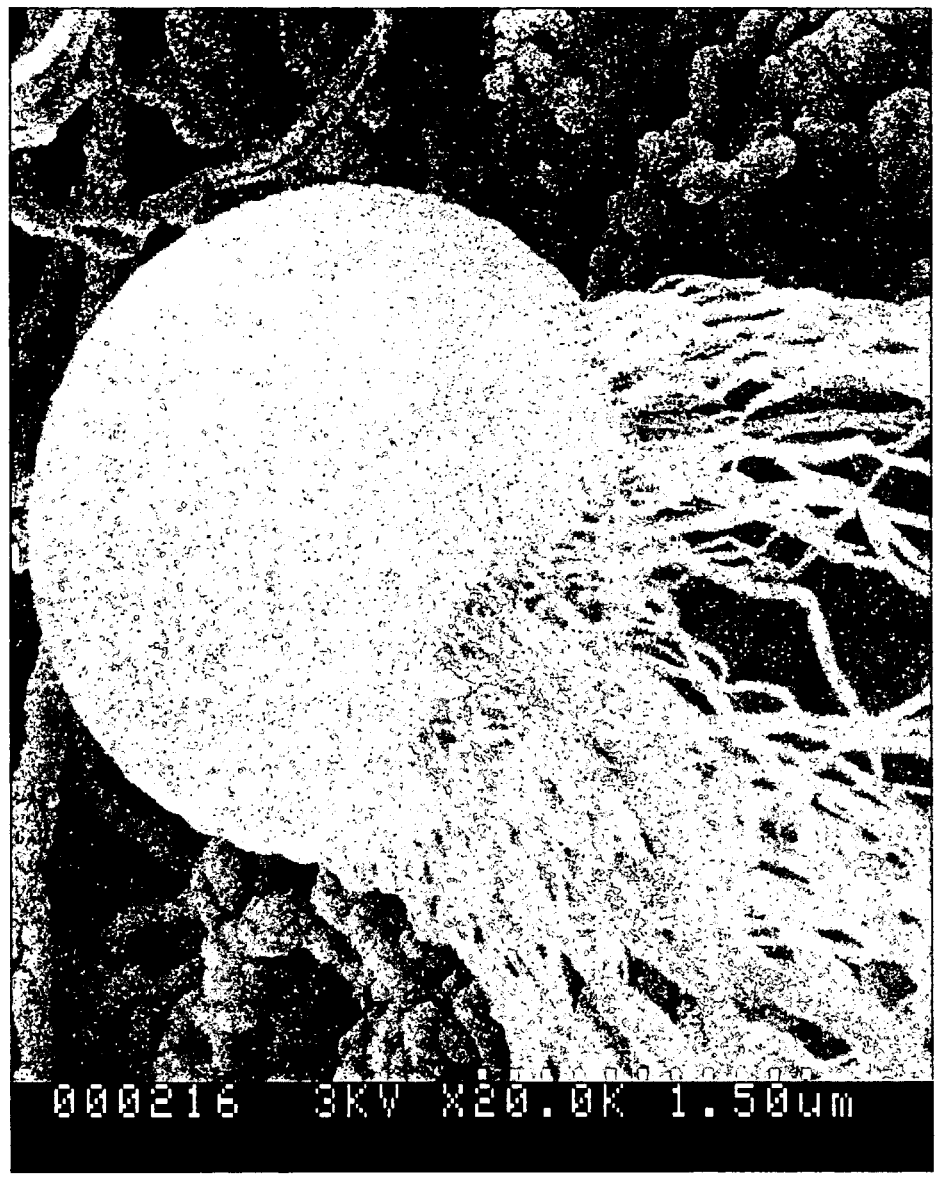
FIG. 35 shows a SEM image showing amorphous silicon nitride nanowires resulting from Ga with exposure to 10% silane.

Using a similar setup as that used for Example 1, the gallium droplet can be exposed to nitrogen, silane, hydrogen or halogen gas phase mixtures at pressures ranging from 100 mTorr to 1 atm. The excitation of gas phase could be done using microwaves or hot-filament or pure thermal means to achieve amorphous silicon nitride fibers and nanowires. FIG. 35 shows an SEM image showing amorphous silicon nitride nanowires resulting from Ga with exposure to 10% silane in nitrogen, microwave plasma at 700 W, and 30 torr pressure.

Example 6

Synthesis of Silicon Oxide Nanowires and Fibers

Figure 36:
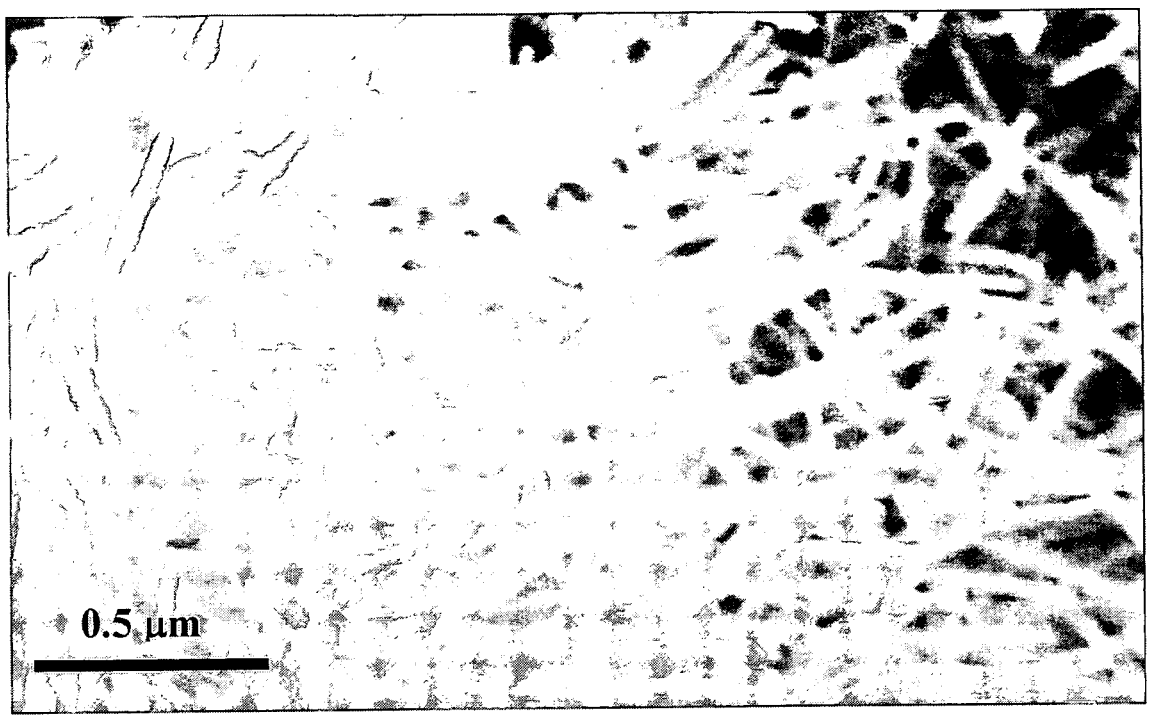
FIG. 36 shows a SEM image showing amorphous silicon oxide nanowires.

Using a similar setup as that used for Example 1, the gallium film covered non-silicon substrates can be exposed to oxygen and silane gas phase using hot-filaments, microwave plasma or thermal means at 100 mTorr-1 atm range to achieve the synthesis of amorphous silica fibers. FIG. 36 shows an SEM image of amorphous silicon oxide nanowires resulting from Ga with exposure to 10% Silane, 10% oxygen in hydrogen, microwave plasma at 700 W, and 30 torr pressure.

Example 7

Synthesis of Bismuth Nanowires

Figure 37:
FIG. 37. SEM micrographs illustrating the growth of fine bismuth fibers out of gallium droplets.

Using the synthesis method mentioned earlier, bismuth fibers were synthesized by simply heating a mixture of gallium and bismuth to temperatures greater than 600° C. In this setup a film of gallium is applied onto a substrate followed by sprinkling bismuth powder on top of the gallium film. The setup is then heated either in vacuum (100 mtorr) or in the presence of hydrogen at pressures of 40-100 torr for about 1 hr at temperatures greater than 600 C. At these temperatures both bismuth and gallium are liquids and during this process, bismuth dissolves into gallium. Upon cooling the system to room temperature, during the cooling process the supersaturated bismuth nucleates out of the melt forming multiple nuclei on the gallium droplets leading to growth of bismuth fibers. FIG. 37 shows a SEM micrographs illustrating the growth of fine bismuth fibers out of gallium droplets. These were synthesized by heating and cooling the gallium-bismuth system.

Figure 38:
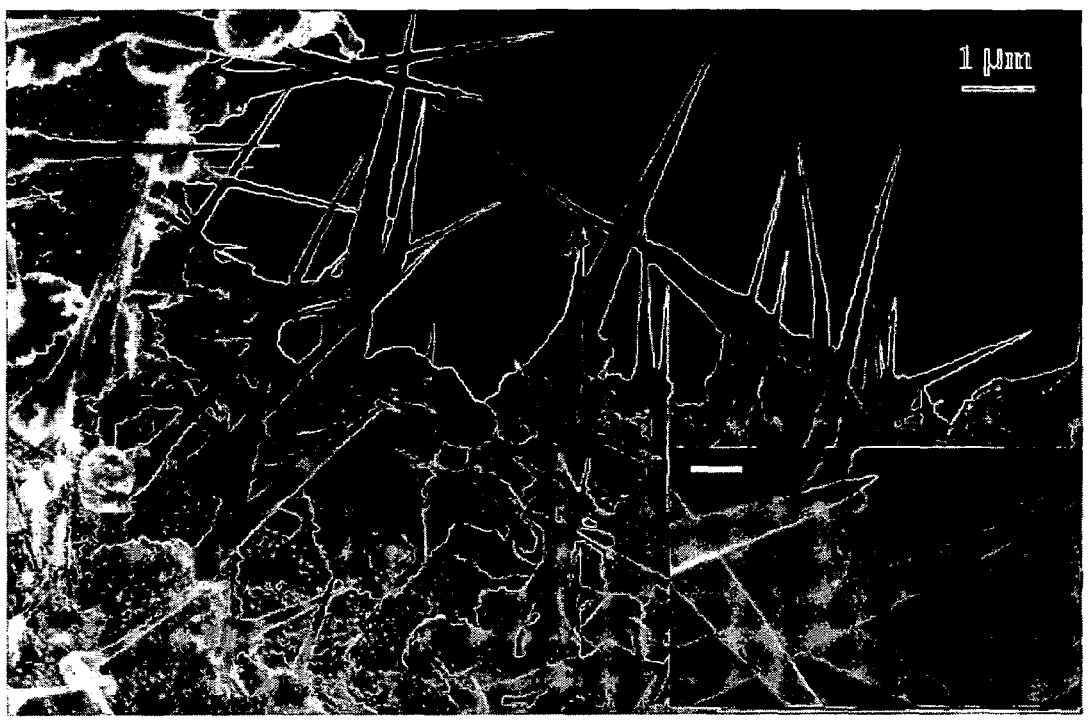
FIG. 38. SEM micrographs of tapered bismuth whiskers.

Using a variation in the above method, by exposing the gallium-bismuth system to hydrogen plasma, tapered bismuth whiskers were synthesized. The diameter of the whiskers are about 2-5 nm at the tip and about 100-300 nm at the base and the length of whiskers is about 10-20 microns as shown in FIG. 38 which shows a SEM micrograph of tapered bismuth whiskers. These morphologies were synthesized by exposing the gallium-bismuth system to microwave plasma.

The foregoing detailed description is given primarily for clearness of understanding and no unnecessary limitations are to be understood therefrom, for modification will become obvious to those skilled in the art upon reading this disclosure and may be made upon departing from the spirit of the invention and scope of the appended claims. Accordingly, this invention is not intended to be limited by the specific exemplifications presented hereinabove. Rather, what is intended to be covered is within the spirit and scope of the appended claims.

We claim:

1. A process for synthesizing bulk amounts of semiconductor nanofibers, the steps comprising:

forming a film of a low-melting metals on a substrate, wherein said low-melting metal is selected from the group consisting of gallium, indium, aluminum, tin, zinc, bismuth, and their oxides, nitrides, sulfides, phosphides, antimonides, and combinations thereof;

placing the combination in a low-pressure chamber;
adding gaseous reactant,
applying energy to raise the temperature in the chamber to a point above the melting point of said low-melting metal;
activating and decomposing the gas phase to yield growth precursors and exposing the molten metal film to the activated gas phase until multiple nanofibers of the desired length are formed.

2. The process of claim 1, wherein the substrate is silicon.

3. The process of claim 1, wherein the low-melting metal comprises gallium.

4. The process of claim 1, wherein said gaseous reactant is atomic hydrogen.

5. The process of claim 2, wherein said nanofibers comprise silicon.

6. The process of claim 1, wherein said gaseous reactant is selected from the group consisting of silane, dichlorosilane, and silicon tetrachloride which decompose yielding a silicon precursor and nanofibers comprising silicon.

7. The process of claim 1, wherein said substrate comprises silicon, quartz, or pyrolytic boron nitride.

8. The process of claim 1, wherein said substrate is germanium.

9. The process of claim 8, wherein the nanofibers comprise germanium.

10. The process of claim 9, wherein said gaseous reactant is atomic hydrogen.

11. The process of claim 1, wherein the substrate is silicon; and
the gaseous reactant is germane that decomposes to yield a germanium precursor and the nanofibers comprise of germanium.

12. The process of claim 1, wherein said substrate is chosen from non-silicon substrates;
and
said gaseous reactant is germane decomposing to yield a germanium precursor and nanofibers comprising germanium.

13. The process of claim 1, wherein the substrate is chosen from non-silicon substrates; and
said gaseous reactant is methane decomposing to yield a carbon precursor and nanofibers comprising carbon.

14. A process for synthesizing bulk amounts of compound nanofibers, the steps comprising:
forming a film of low-melting metal on a substrate, wherein said low-melting metal is selected from the group consisting of gallium, indium, aluminum, tin, zinc, bismuth, and their oxides, nitrides, sulfides, phosphides, antimonides, and combinations thereof;
placing the combination in a low-pressure chamber;
adding at least one gaseous reactant;
applying energy to raise the temperature in the chamber to a point above the melting point of said low-melting metal to produce molten droplets of said low-melting metal and form a molten low-melting metal film;
activating and decomposing said at least one gaseous reactant in an activated gas phase to yield growth precursors; and
exposing said molten low-melting metal film to said activated gas phase until multiple nanofibers form of a desired length.

15. The process of claim 14, wherein
said at least one gaseous reactant comprises a mixture of silane and oxygen decomposing to yield a growth precursor;
and said nanofibers comprise silicon oxide.

16. The process of claim 14, wherein
said at least one gaseous reactant comprises a mixture of silane and nitrogen decomposing to yield a growth precursor;
and said nanofibers comprise silicon nitride.

17. The process of claim 14, wherein
said at least one gaseous reactant comprises a mixture of silane, oxygen, and nitrogen decomposing to yield a growth precursor;
and said nanofibers comprise silicon oxynitride.

18. The process of claim 14, wherein
said at least one gaseous reactant comprises a mixture of germane and oxygen decomposing to yield a growth precursor;
and said nanofibers comprise germanium oxide.

19. The process of claim 14, wherein
said at least one gaseous reactant comprises a mixture of germane and nitrogen decomposing to yield a growth precursor;
and said nanofibers comprise germanium nitride.

20. The process of claim 14, wherein
said at least one gaseous reactant comprises a mixture of germane, oxygen, and nitrogen decomposing to yield a growth precursor;
and said nanofibers comprise germanium oxynitride.

21. The process of claim 1, further comprising the step of raising the temperature in said chamber in a range of from 30° C. to 900° C.

22. The process of claim 14, further comprising the step of raising the temperature in said chamber in a range of from 30° C. to 900° C.

23. The process of claim 1, wherein the energy provided to raise the substrate temperature and to activate and decompose said gas phase reactant is provided by means of thermal, hot-wire, microwave, DC, IC, or radio frequency excitation.

24. The process of claim 14, wherein the energy provided to raise the substrate temperature and to activate and decompose said gas phase reactant is provided by means of thermal, hot-wire, microwave, DC, IC, or radio frequency excitation.

25. The process of claim 1, wherein said substrate is heated to a temperature between the melting point and boiling point of the selected low-melting metal.

26. The process of claim 14, wherein said substrate is heated to a temperature between the melting point and boiling point of the selected low-melting metal.

27. The process of claim 1, wherein the pressure in the low-pressure chamber ranges from between 3 milliTorr and 760 Torr.

28. The process of claim 14, wherein the pressure in the low-pressure chamber ranges from between 3 milliTorr and 760 Torr.

29. The process of claim 1, wherein said low-melting metal film comprises the shape of a droplet.

30. The process of claim 14, wherein said low-melting metal film comprises the shape of a droplet.

31. The process of claim 1, wherein said low-melting metal film comprises the shape of a film.

32. The process of claim 14, wherein said low-melting metal film comprises the shape of a film.

33. The process of claim 1, wherein the lateral dimension of the molten low-melting metal droplets resulting from heating the initial low-melting metal film ranges from 10 nanometers to several inches.

34. The process of claim 14, wherein the lateral dimension of the molten low-melting metal droplets resulting from heating the initial low-melting metal film ranges from 10 nanometers to several inches.

35. The process of claim 1, wherein the thickness of the metal film resulting from heating the initial low-melting metal film can range from 10 nanometers to 100 microns.

36. The process of claim 14, wherein the thickness of the metal film resulting from heating the initial low-melting metal film can range from 10 nanometers to 100 microns.

37. A process for synthesizing bulk amounts of semiconductor nanofibers, the steps comprising:
   rapid dissolution of a solute in a dissolution media comprising a low-melting metal forming a film on a substrate, wherein said low-melting metal is selected from the group consisting of gallium, indium, aluminum, tin, zinc, bismuth, and their oxides, nitrides, sulfides, phosphides, antimonides, and combinations thereof;
   placing the combination in a low-pressure chamber;
   adding gaseous reactant;
   applying energy to raise the temperature in the chamber to a point above the melting point of the metal;
   activating and decomposing the gas phase to yield growth precursors and exposing the molten metal film to the activated gas phase;
   forming multiple nuclei surfacing out of said molten low-melting metal film; and
   basal growing of nuclei in one dimension forming nanometer size fibers of the desired length.

38. The process of claim 37, wherein said solute is silicon.

39. The process of claim 38, wherein said low-melting metal is gallium.

40. A process for synthesizing bulk amounts of semiconductor nanofibers, the steps comprising:
   disposing a low-melting metal on a substrate, wherein said low-melting metal is selected from the group consisting of gallium, indium, aluminum, tin, zinc, bismuth, and their oxides, nitrides, sulfides, phosphides, antimonides, and combinations thereof;
   placing said low-melting metal on said substrate in a low-pressure chamber;
   adding a gaseous reactant;
   applying energy to raise the temperature in said low-pressure chamber to a point above the melting point of said low-melting metal on said substrate forming a molten metal film;
   activating and decomposing a gas phase yielding growth precursors and exposing said molten metal film to said activated gas phase; and
   continuing the process forming multiple nanofibers of the desired length.

41. A method of synthesizing bulk quantities of crystalline metal oxide nanowires from noncatalytic low-melting metals, comprising the steps of:
   placing a noncatalytic low-melting metal on a substrate in a low pressure chamber, wherein said low-melting metal is selected from the group consisting of gallium, indium, aluminum, tin, zinc, bismuth, and their oxides, nitrides, sulfides, phosphides, antimonides, and combinations thereof;
   simultaneously exposing said noncatalytic low melting metal to a microwave plasma containing a selected gaseous reactant in a gas phase heated to a temperature above the melting point of said low-melting metal forming a molten low-melting metal on said substrate and exposing said molten low-melting metal to a sufficient amount of said gaseous reactant in said gas phase for forming a metal oxide;
   forming multiple nucleations and growing noncatalytic low melting metal oxide nanostructures directly therefrom creating crystalline metal oxide nanowires devoid of any structural defects.

42. The method of claim 41, wherein said gaseous reactant is monoatomic hydrogen.

43. The method of claim 41, wherein said gaseous reactant is monoatomic oxygen.

44. The method of claim 41, wherein said gaseous reactant is monoatomic hydrogen and monoatomic oxygen.

* * * * *

UNITED STATES PATENT AND TRADEMARK OFFICE
CERTIFICATE OF CORRECTION

PATENT NO. : 7,713,352 B2  Page 1 of 1
APPLICATION NO. : 11/521084
DATED : May 11, 2010
INVENTOR(S) : Sunkara et al.

It is certified that error appears in the above-identified patent and that said Letters Patent is hereby corrected as shown below:

IN THE CLAIMS:

Claim 1, col. 10, line 63: Change the word "metals" to "metal"

Signed and Sealed this

Twentieth Day of July, 2010

David J. Kappos
*Director of the United States Patent and Trademark Office*